US006239729B1

(12) United States Patent
Takeuchi

(10) Patent No.: US 6,239,729 B1
(45) Date of Patent: May 29, 2001

(54) IMAGE PROCESSOR AND INTEGRATED CIRCUIT FOR THE SAME

(75) Inventor: Kesatoshi Takeuchi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/341,696

(22) PCT Filed: Nov. 26, 1998

(86) PCT No.: PCT/JP98/05321

§ 371 Date: Jul. 26, 1999

§ 102(e) Date: Jul. 26, 1999

(87) PCT Pub. No.: WO99/27494

PCT Pub. Date: Jun. 3, 1999

(30) Foreign Application Priority Data

Nov. 26, 1997 (JP) .................................................. 9-342139

(51) Int. Cl.[7] ...................................................... H03M 9/00

(52) U.S. Cl. .......................... 341/100; 341/155; 382/304

(58) Field of Search .................................... 341/100, 155; 382/304

(56) References Cited

U.S. PATENT DOCUMENTS 4,385,381 * 5/1983 Alexis ................................. 370/210
4,539,683 * 9/1985 Hahn et al. .......................... 341/120
5,005,027 * 4/1991 Oshima et al. ...................... 347/184
5,432,813 * 7/1995 Barham et al. ...................... 375/152

* cited by examiner

*Primary Examiner*—Michael Tokar
*Assistant Examiner*—Daniel D. Chang
(74) *Attorney, Agent, or Firm*—Oblon, Spivak, McClelland, Maier & Neustadt, P.C.

(57) ABSTRACT

A digital image signal is latched by four latches respectively in response to four latch clock signs, which have a frequency that is ¼ of a frequency of a dot clock signal and phases that are mutually shifted by every period of the dot dock signal. The four latched digital image signals are further latched by a common latch in response to a common latch signal. The digital image signals with respect to four consecutive pixels are then output as one set of digital image signals. The output digital image signals are written into consecutive storage areas in a frame memory, in response to a write sampling dock signal which has a frequency that is ¼ of the frequency of the dot clock signal The number of latches is regulated according to a frequency of an analog image signal. This arrangement facilitates image processing for high-frequency image signals.

24 Claims, 17 Drawing Sheets

Fig.3(a) AV1
Fig.3(b) SDCLK1
Fig.3(c) DCLK1
Fig.3(d) DV1
Fig.3(e) SLT1
Fig.3(f) D1
Fig.3(g) SLT2
Fig.3(h) D2
Fig.3(i) SLT3
Fig.3(j) D3
Fig.3(k) SLT4
Fig.3(l) D4
Fig.3(m) CLT
Fig.3(n) Dcom
Fig.3(o) Sw
#1
#2
#3
#4
#5
#6
#7
#8
#1, 2, 3, 4
REGULATION RANGE Fig. 4 (a) AV1
Fig. 4 (b) SDCLK1
Fig. 4 (c) DCLK1
Fig. 4 (d) DV1
Fig. 4 (e) SLT1
Fig. 4 (f) D1
Fig. 4 (g) SLT2
Fig. 4 (h) D2
Fig. 4 (i) SLT3
Fig. 4 (j) D3
Fig. 4 (k) SLT4
Fig. 4 (l) D4
Fig. 4 (m) CLT
Fig. 4 (n) Dcom
Fig. 4 (o) Sw
#1
#2
#3
#1
#2
#3
#1
#4
#2
#5
#3
#6
#1, #2, #3
#4, #5, #6

Fig. 7(a) AV1
Fig. 7(b) SDCLK1
Fig. 7(c) DCLK1
Fig. 7(d) DV1
Fig. 7(e) SLT1
Fig. 7(f) D1
Fig. 7(g) SLT2
Fig. 7(h) D2
Fig. 7(i) SLT3
Fig. 7(j) D3
Fig. 7(k) SLT4
Fig. 7(l) D4
Fig. 7(m) CLT
Fig. 7(n) Sw
Fig. 7(o) Dcom (EXT.)
#1
#2
#3
#4
#5
#6
#7
#8
REGULATION RANGE
#1, 2, 3, 4

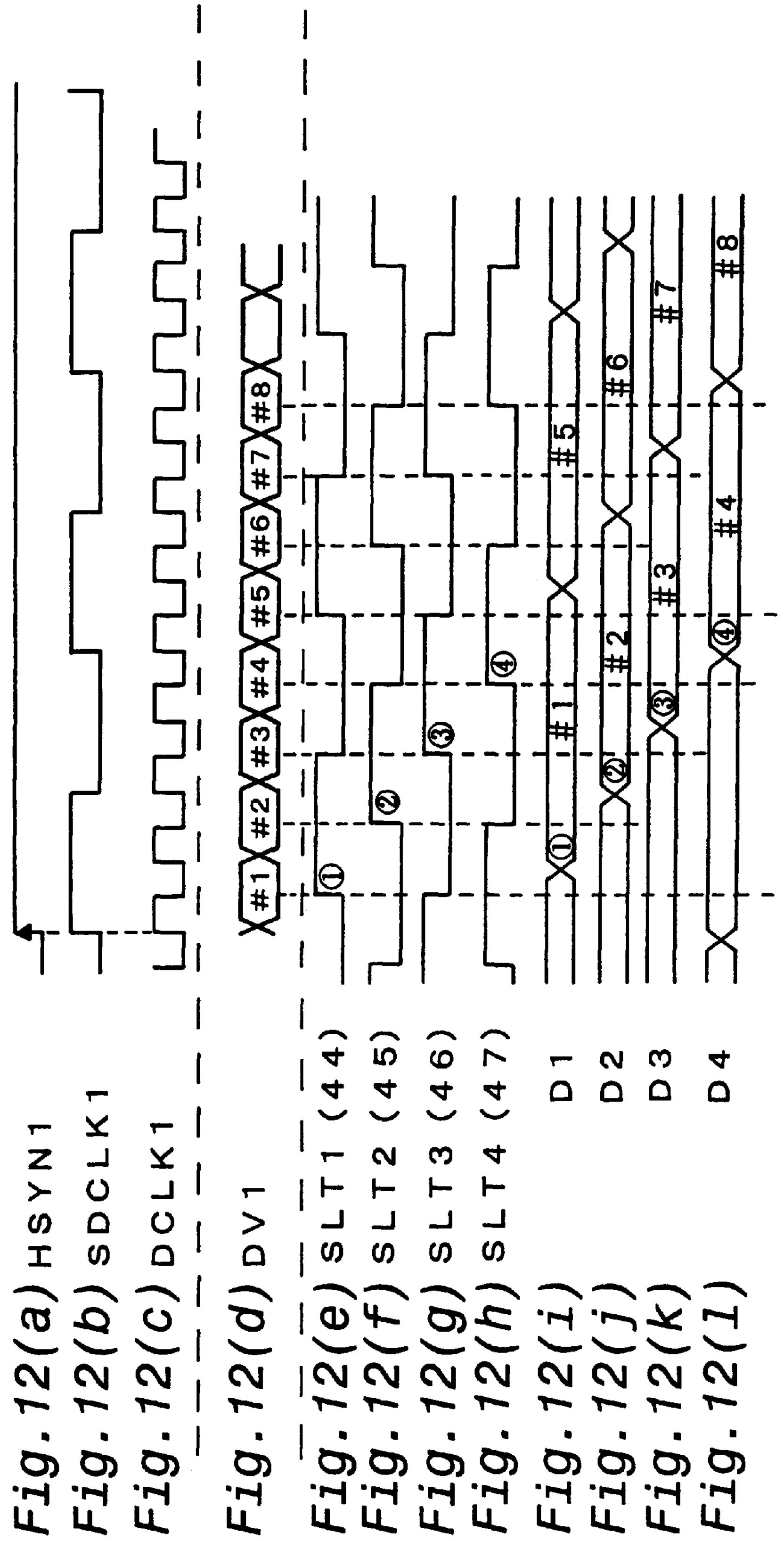
Fig.12(a) HSYN1
Fig.12(b) SDCLK1
Fig.12(c) DCLK1
Fig.12(d) DV1
Fig.12(e) SLT1 (44)
Fig.12(f) SLT2 (45)
Fig.12(g) SLT3 (46)
Fig.12(h) SLT4 (47)
Fig.12(i) D1
Fig.12(j) D2
Fig.12(k) D3
Fig.12(1) D4
#1
#2
#3
#4
#5
#6
#7
#8
①
②
③
④

IMAGE PROCESSOR AND INTEGRATED CIRCUIT FOR THE SAME

BACKGROUND OF THE INVENTION

1. Field of the Invention

The present invention relates to an image processing apparatus having the functions of A-D conversion and D-A conversion as well as to an integrated circuit used therefor. More specifically the present invention pertains to a technique of processing high-frequency image signals.

2. Discussion of the Background

In an image processing apparatus, input analog image signals are converted into digital image signals by an A-D converter. The converted digital image signals undergo a variety of image processing operations and are subsequently returned to analog image signals through D-Aconversion. A resulting image is then displayed on a display device.

The frequency of image signals to be processed by such an image processing apparatus tends to be heightened with the recent advances in video technology. It is accordingly required to enhance the processing speed of the hardware circuit that actualizes the image processing apparatus with an increase in frequency of the image signals. The processing speed of the hardware circuit, however, generally depends upon the performances of the respective devices constituting the hardware circuit, so that it is difficult to process the high-frequency image signals.

SUMMARY OF THE INVENTION

An object of the present invention is thus to provide a technique for readily processing high-frequency image signals.

At least part of the above and the other related objects is attained by a first image processing apparatus, which includes: a first dot clock generation circuit that generates a first dot clock signal, which is synchronous with a first synchronizing signal of a given first analog image signal and has a frequency suitable for sampling the first analog image signal; anA-D converter that quantizes the first analog image signal to convert the first analog image signal into digital image signals, and sequentially outputs the digital image signals for respective pixels sampled in synchronism with the first dot clock signal; a series-to parallel converter having Mw signal hold circuits that respectively and sequentially hold the digital image signals with respect to Mw consecutive pixels, the series-to-parallel converter outputting in parallel the digital image signals with respect to Nw consecutive pixels, where Mw is an integer of not less than 2 and Nw is an integer of not less than 1 but not greater than Mw, Nw representing a number of signal hold circuits that are actually used; a first sampling clock generation circuit that generates a first sampling clock signal, which is synchronous with the first synchronizing signal and has a frequency that is 1/Nw of the frequency of the first dot clock signal; a second sampling clock generation circuit that generates Nw second sampling clock signals where Nw corresponds to the number of the signal hold circuits used, the Nw second sampling clock signals having the frequency of the first sampling clock signal and different phases that are mutually shifted by one period of the first dot clock signal; and a write control signal regulator that regulates the operation of the first sampling clock generation circuit and the second sampling clock generation circuit and supplies the Nw second sampling clock signals to the Nw signal hold circuits, so as to cause the digital image signals with respect to the Nw consecutive pixels to be output from the series-to-parallel converter as one set of digital image signals.

In this image processing apparatus, the Nw signal hold circuits respectively hold the digital image signals with respect to the Nw consecutive pixels, which have been quantized by and output from the A-D converter. The series-to-parallel converter then outputs the digital image signals of the Nw consecutive pixels in parallel as one set of digital image signals. This arrangement enables the digital image signal to be processed at the frequency, which is 1/Nw of the frequency that is the relatively low frequency of the first dot dock signal. The write controller causes the Nw digital image signals thus obtained to be written into consecutive memory areas in the image memory, so that the image signals are stored in the sequence of the original array of pixels in the image memory In this image processing apparatus, the number Nw of the signal hold circuits is regulated according to the frequency of the first analog image signal This enables the digital image signal to be processed at the relatively low frequency of the first sampling clock signal, even when the first dot clock signal has a high frequency This structure ensures processing of the first analog image signal having a wide frequency range from a relatively low frequency to a very high frequency.

In accordance with one preferable application of the present invention, the image processing apparatus further includes a selective control circuit that suspends operation of Mw−Nw) signal hold Sits which are not used, wherein the write control signal regulator controls the selective control circuit according to the number Nw.

This arrangement suspends operation of the (Mw−Nw) signal hold circuits and thus advantageously reduces the power consumption.

In accordance with one preferable application, the image processing apparatus further includes a number determination circuit that determines the number Nw of the signal hold circuits used according to the frequency of the first dot clock signal.

The number determination circuit determines automatically the number Nw of the signal hold circuits according to the frequency of the first dot clock signal or more specifically, for example, based on the relationship between the frequency of the first dot clock signal and signal frequency that enables the digital image signals output from the series-to-parallel converter to be processed in the image processing apparatus. This arrangement ensures automatically processing of the first analog image signal having a wide frequency range from a relatively low frequency to a very high frequency In the image processing apparatus of the present invention, it is preferable that the Nw second sampling clock signals having the mutually shifted phases are output together with the one set of digital image signals from the image processing apparatus.

This arrangement enables the one set of digital image signals to be securely sampled by utilizing the Nw second sampling clock signals, which have the mutually shifted phases and are used in the Nw signal hold circuits.

In accordance with one preferable application of the image processing apparatus, the second sampling clock generation circuit generates the Nw second sampling clock signals having the mutually shifted phases, in response to the first sampling dock signal and the first dot clock signal.

Alternatively the second sampling clock generation circuit may generate the Nw second sampling dock signals having the mutually shifted phases by successively delaying the first sampling clock signal.

In accordance with another preferable application of the image processing apparatus, the first sampling dock generation circuit further generates a 90-degree phase shift clock signal having a phase difference of 90 degrees from the first sampling dock signal and the second sampling dock generation circuit generates the Nw second sampling dock signals having the mutually shifted phases, in response to the first sampling dock signal and the 90-degree phase shift clock signal.

In any of the above applications, the second sampling clock generation circuit readily generates the Nw second sampling dock signals having the mutually shifted phases. Among the three alternative arrangements of the second sampling clock generation circuit, especially the second and the third arrangements ensure generation of the second sampling dock signals without using the high-frequency first dot clock signal. This advantageously simplifies the structure of the second sampling dock generation circuit.

In accordance with one preferable arrangement of the image processing apparatus, the second sampling dock generation circuit initializes the Nw second sampling clock signals having the mutually shifted phases, in response to the pulse of the first synchronizing signal so that the first synchronizing signal and each of the Nw second sampling clock signals having the mutually shifted phases has a predetermined phase relation.

In this application, each of the Nw second sampling dock signals keeps the predetermined phase relation to the first synchronizing signal so that the pixels arrayed in the time series of the first analog image signal interposed between the pulses of the first synchronizing signal are sampled at the predetermined phase relation.

In accordance with another preferable application of the present invention, the image processing apparatus further includes a third sampling clock generation circuit that generates a third sampling clock signal having a phase suitable for sampling the one set of digital image signals, the third sampling clock signal being output from the image processing apparatus together with the one set of digital image signals.

This arrangement ensures sampling of one set of digital image signals by utilizing the third sampling dock signal.

In accordance with still another preferable application, the image processing apparatus further includes a fourth sampling clock generation circuit that generates a fourth sampling clock signal which is synchronous with the first synchronizing signal and has a frequency that is Nx times the frequency of the first dot clock signal where Nx is an integer of not less than 2. The A-D converter comprises a $\Delta\Sigma$ modulation circuit and a digital filter, and quantizes the first analog image signal in response to the fourth sampling clock signal and sequentially outputs the digital image signals of the respective pixels sampled synchronously with the first dot clock signal.

The A-D converter with a $\Delta\Sigma$ modulation circuit and a digital further has a relatively small-sized configuration to attain the high-speed processing with a high accuracy In accordance with one preferable application, the first analog signal includes a plurality of color component signals. The A-D converter includes a plurality of A-D converter elements for the respective color component signals, and the series-to-parallel converter includes a plurality of converter elements for the respective color component signals.

In accordance with one preferable arrangement of the image processing apparatus, the series-to-parallel converter includes multiple-stage digital image signal phase regulation circuits to output the Nw digital image signals at an identical phase. The multiple-stage digital image signal phase regulation circuits have a hierarchical structure, where the number of circuits included in each stage gradually decreases towards a last stage. Each of plural digital image signal phase regulation circuits included in each stage except the last stage holds a plurality of input digital image signals at a predetermined phase, which is different from the phases of the other digital image signal phase regulation circuits included in the same stage and supplies the digital image signals of the predetermined phase to a digital image signal phase regulation circuit included in a next stage. The digital image signal phase regulation circuits included in the last stage holds the Nw digital image signals at an identical phase, which are supplied from a preceding stage.

This arrangement ensures the sampling at relatively marginal timings in the digital image signal phase regulation circuits of the respective stages, so that the Nw digital image signals having the mutually shifted phases are readily converted to the digital image signals of an identical phase.

It is preferable that the image processing apparatus further includes: an image memory that stores digital image signals; and a write controller that writes the digital image signals with respect to the Nw consecutive pixels into a consecutive storage area in the image memory.

The write controller writes the Nw digital image signals with respect to the Nw consecutive pixels into the consecutive storage area in the image memory, so that the image signals are stored according to the original sequence of pixels in the image memory.

The write controller may include a multiple-stage digital image signal phase regulation circuits to output the Nw digital image signals, which are output in parallel from the series-to-parallel converter at an identical phase. The multiple-stage digital image signal phase regulation circuits have a hierarchical structure, where the number of circuits included in each stage gradually decreases towards a last stage. Each of plural digital image signal phase regulation circuits included in each stage except the last stage holds a plurality of input digital image signals at a predetermined phase, which is different from the phases of the other digital image signal phase regulation circuits included in the same stage and supplies the digital image signals of the predetermined phase to a digital image signal phase regulation circuit included in a next stage. The digital image signal phase regulation circuits included in the last stage holds the Nw digital image signals at an identical phase, which are supplied from a preceding stage.

In accordance with another preferable application, the image processing apparatus further includes: Mr D-A converters, where Mr is an integer of not less than 2; a second dot clock generation circuit that generates a second dot clock signal having a frequency suitable for sampling a second analog image signal -to-be-output; fifth sampling clock generation circuits that generates a fifth sampling clock signal which has a frequency that is 1/Nr the frequency of the second dot clock signal, where Nr is an integer of not less than 1 but not greater than Mr and represents a number of D-A converters that are actually used, the fifth sampling clock signal being synchronous with a second synchronizing signal of the second analog image signal, a sixth sampling clock generation circuit that generates Nr sixth sampling clock signals based on the second dot dock signal, the sixth sampling clock signals having the frequency of the fifth sampling clock signal and different phases that are mutually shifted by one period of the second dot clock signal; a read controller that reads digital image signals with respect to Nr consecutive pixels from the image memory in synchronism with the fifth sampling clock signal; a D-A conversion selective control circuit that suspends operation of (Mr−Nr) D-A converters according to the number Nr; a read control signal regulator that determines the number Nr of the D-A converters used according to the frequency of the second dot clock signal to control the D-A conversion selective control circuit, regulates operation of the fifth sampling clock generation circuit and the sixth sampling clock generation circuit according to the number Nr, and causes the digital image signals with respect to the Nr consecutive pixels to be successively subjected to D-A conversion by the Nr D-A converters according to the Nr fifth sampling dock signals, so as to generate Nr partial analog image signals having different phases; and a video switch that successively switches the Nr partial analog image signals output from the Nr D-A converters in synchronism with the second dot clock signal so as to generate the second analog image signal.

In the image processing apparatus of this preferable structure, the D-A converters carry out D-A conversion at the frequency that is 1/Nr of the frequency of the second dot clock signal Namely the digital image signals can be converted at the relatively low frequency into the high-frequency analog signals. The video switch successively switches the Nr partial analog image signals, so as to generate the analog image signal that represents an image having the original pixel array. The number Nw of the signal hold circuits and the number Nr of the D-A converters may be different from each other or alternatively equal to each other. In the first image processing apparatus of this structure, regulation of the number Nr of the D-A converters according to the frequency of the second analog image signal ensures processing of the second analog image signal that has a wide frequency range from a relatively low frequency to a very high frequency. The structure of this application suspends the operation of the (Mr−Nr) unused D-A converters, thereby effectively saving the power consumption.

The present invention is further directed to an integrated circuit, which includes: a first dot clock generation circuit that generates a first dot clock signal, which is synchronous with a first synchronizing signal of a given first analog image signal and has a frequency suitable for sampling the first analog image signal; an A-D converter that quantizes the first analog image signal to convert the first analog image signal into digital image signals, and sequentially outputs the digital image signals for respective pixels sampled in synchronism with the first dot clock signal; a series-to-parallel converter having Mw signal hold circuits that respectively and sequentially hold the digital image signals with respect to Mw consecutive pixels, the series-to-parallel converter outputting in parallel the digital image signals with respect to Nw consecutive pixels, where Mw is an integer of not less than 2 and Nw is an integer of not less than 1 but not greater than Mw, Nw representing a number of signal hold circuits that are actually used; a first sampling dock generation circuit that generates a first sampling clock signal, which is synchronous with the first synchronizing signal and has a frequency that is 1/Nw of the frequency of the first dot clock signal; a second sampling dock generation circuit that generates Nw second sampling dock signals where Nw corresponds to the number of the signal hold circuits used, which is set based on the frequency of the first dot dock signal, wherein the Nw second sampling clock signals have the frequency of the first sampling clock signal and different phases that are mutually shifted by one period of the first dot dock signal. The operation of the first sampling clock generation circuit and the second sampling dock generation circuit is regulated according to the number Nw of the signal hold circuits used, and the Nw second sampling clock signals are supplied to the Nw signal hold circuits, so that the digital image signals with respect to the Nw consecutive pixels are output from the series-to-parallel converter as one set of digital image signals.

Application of the integrated circuit to an image processing apparatus ensures the same functions and effects as those of the first and the second image processing apparatuses of the present invention The frequency of the digital image signals output from the integrated circuit of the present invention is relatively low as 1/Nw of the frequency of the first dot dock signal. This arrangement reduces the effects of the noise due to the presence of the high-frequency signals.

In accordance with one preferable application of the present invention, the integrated circuit further includes a selective control circuit that suspends operation of Mw−Nw) signal hold circuits which are not used, wherein operation of the selective control circuit is controlled according to the number Nw of the signal hold circuits used.

This arrangement suspends operation of the (Mw−Nw) signal hold circuits and thus advantageously reduces the power consumption.

In the integrated circuit of the above structure, it is preferable that the Nw second sampling dock signals having the mutually shifted phases are output together with the one set of digital image signals from the integrated circuit.

This arrangement enables the one set of digital image signals output from the integrated circuit to be securely sampled by utilizing the Nw second sampling clock signals having the mutually shifted phases.

In accordance with one preferable application of the integrated circuit, the second sampling clock generation circuit generates the Nw second sampling clock signals having the mutually shifted phases, in response to the first sampling clock signal and the first dot clock signal.

Alternatively the the second sampling clock generation circuit may generate the Nw second sampling clock signals having the mutually shifted phases by successively delaying the first sampling clock signal.

In accordance with another preferable application of the integrated circuit, the first sampling dock generation circuit further generates a 90-degree phase shift clock signal having a phase difference of 90 degrees from the first sampling clock signal and the second sampling clock generation circuit generates the Nw second sampling clock signals having the mutually shifted phases, in response to the first sampling clock signal and the 90-degree phase shift clock signal.

It is also preferable that the second sampling clock generation circuit initializes the Nw second sampling clock signals having the mutually shifted phases, in response to the pulse of the first synchronizing signal, so that the first synchronizing signal and each of the Nw second sampling clock signals having the mutually shifted phases has a predetermined phase relation.

In accordance with another preferable application of the present invention, the integrated circuit further includes a third sampling clock generation circuit that generates a third sampling dot signal having a phase suitable for sampling the one set of digital image signals, the third sampling clock signal being output from the image processing apparatus together with the one set of digital image signals.

In accordance with another preferable application, the integrated circuit further includes a fourth sampling clock generation circuit that generates a fourth sampling clock signal, which is synchronous with the first synchronizing signal and has a frequency that is Nx times the frequency of the first dot clock signal, where Nx is an integer of not less than 2. The A-D converter comprises a ΔΣ modulation circuit and a digital filter, and quantizes the first analog image signal in response to the fourth sampling dock signal and sequentially outputs the digital image signals of the respective pixels sampled synchronously with the first dot clock signal.

The A-D converter with a ΔΣ modulation circuit and a digital filter has a relatively small-sized configuration to attain the high-speed processing with a high accuracy, and is thereby suitably applicable for the integrated circuit of the present invention.

BRIEF DESCRIPTION OF THE DRAWINGS

FIGS. 12(*a*) through 12(*l*) are timing carts showing the outputs of digital image signals D1 through D4;

DETAILED DESCRIPTION OF THE PREFERRED EMBODIMENTS

A. First Embodiment

Figure 1:
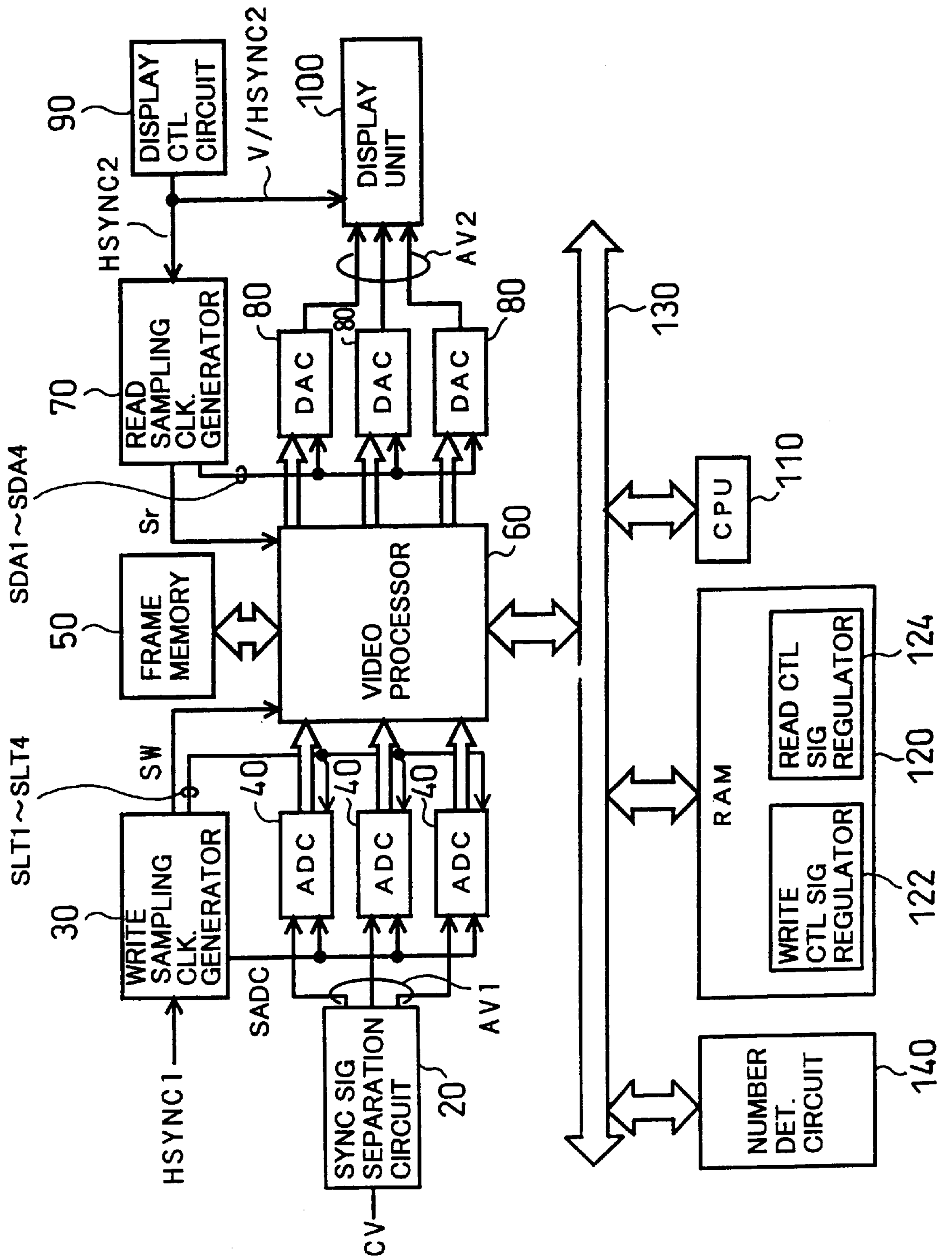
FIG. 1 is a block diagram illustrating the general structure of an image processing apparatus in a first embodiment according to the present invention.

FIG. 1 is a block diagram illustrating the general structure of an image processing apparatus embodying the present invention. The image processing apparatus is constructed as a computer including a synchronizing signal separation circuit 20, a write sampling clock generator 30, three A-D conversion units 40 respectively corresponding to image signals of three colors R. G, and B, a frame memory 50, a video processor 60, a read sampling clock generator 70, three D-A conversion units 80 respectively corresponding to the image signals of the three colors R, G, and B, a display control circuit 90, a display unit 100, a CPU 110, a number determination Suit 140, and a RAM 120. The video processor 60, the CPU 110, the RAM 120, and the number determination circuit 140 are mutually connected via a bus 130. The two sampling dock generators 30 and 70 as well as the display control circuit 90 is also connected to the bus 130, although the connection is omitted from the illustration of FIG. 1.

The synchronizing signal separation circuit 20 separates synchronizing signals (a vertical synchronizing signal VSYNC1 and a horizontal synchronizing signal HSYNC1) from an input composite image signal CV and outputs the synchronizing signals and a component image signal AV1 (that is, an analog image signal that is not composed of synchronizing signals). The component image signal AV1 consists of three color signals representing an image of three colors R, G, and B. The horizontal synchronizing signal HSYNC1 separated by the synchronizing signal separation circuit 20 is given to the write sampling dock generator 30.

The respective color signals of the component image signal AV1 output from the synchronizing signal separation circuit 20 are converted into digital image signals by the three A-D conversion units 40. The detailed operation of the A-D conversion units 40 will be discussed later.

The video processor 60 is a microprocessor that caries out control operations for writing and reading images into and from the frame memory 50. The digital image signals output from the three A-D conversion units 40 are once written into the frame memory 50 and read from the frame memory 50 according to the requirements. Although not specifically described in this embodiment, a variety of image processing operations, for example, expansion and contraction of an image, are generally carried out in the course of writing or reading the image signals into or from the frame memory 50. The digital image signals read from the frame memory 50 are converted into three analog color signals by the three D-A conversion units 80. The details of this conversion will be described later. An analog image signal AV2 consisting of the three color signals is given to the display unit 100. The display unit 100 displays a resulting image in response to the analog image signal AV2 and synchronizing signals (a vertical synchronizing signal VSYNC2 and a horizontal synchronizing signal HSYNC2) output from the display control circuit 90.

The A-D conversion and the operation of writing image signals into the frame memory 50 are carried out synchronously with the synchronizing signal output from the synchronizing signal separation circuit 20. The write sampling clock generator 30 generates a plurality of clock signals, which will be utilized by the A-D conversion units 40, based on the horizontal synchronizing signal HSYNC1 and supplies the plurality of clock signals to the A-D conversion units 40. The write sampling clock generator 30 also generates a write sampling clock signal Sw and supplies the write sampling clock signal Sw to the video processor 60. The write sampling clock signal Sw which will be utilized by a variety of operations executed via the video processor 60, for example, a writing operation into the frame memory 50.

The operation of reading the image signals from the frame memory 50 and the D-A conversion of the read-out image signals are carried out synchronously with the synchronizing signals output from the display control circuit 90. The read sampling dock generator 70 generates a plurality of clock signals, which will be utilized by the D-A conversion units 80, based on the horizontal synchronizing signal HSYNC2 and supplies the plurality of clock signals to the D-A conversion units 80. The read sampling clock generator 70 also generates a read sampling dock signal Sr and supplies the read sampling dock signal Sr to the video processor 60. The read sampling clock signal Sr will be utilized by a variety of image processing operations executed via the video processor 60, for example, a reading operation from the frame memory 50.

Computer programs functioning as a write control signal regulator 122 and computer programs functioning as a read control signal regulator 124 are stored in the RAM 120. The write control signal regulator 122 sets parameters (discussed later) for regulating the frequency of the various dock signals used in the writing process, into the write sampling clock generator 30. The read control signal regulator 124, on the other hand, sets parameters (discussed later) for regulating the frequency of the various clock signals used in the reading process, into the read sampling dock generator 70. The detailed functions of the respective units will be described later.

The computer programs for realizing the functions of these units may be recorded in computer readable recording media, such as floppy disks and CD-ROMs. The computer (image processing apparatus) reads the computer programs from the recording media and transfers the computer programs into an internal storage device or an external storage device. Alternatively the computer programs may be supplied from a program supply apparatus to the computer via a communication path. The CPU 110 (microprocessor) of the computer executes the computer programs stored in the internal storage device, in order to actualize the functions of the computer. The computer may otherwise directly execute the computer programs recorded on the recording media.

In this specification, the computer is the concept including both a hardware apparatus and an operating system, and represents the hardware apparatus working under the control of the operating system. When the operating system is not required and an applications program alone can operate the hardware apparatus, the hardware apparatus itself corresponds to the computer The hardware apparatus at least has a microprocessor, such as a CPU, and means for reading the computer programs recorded on the recording media. The computer programs include program codes that cause the computer to carry out the functions of the respective units discussed above. Part of the above functions may be executed by the operating system, instead of the applications program. Available examples of the 'recording media' in the present invention include flexible disks, CD-ROMs, magneto-optic discs, IC cards, ROM cartridges, punched cards, prints with bar codes or other codes printed thereon, a variety of internal storage devices (memories like RAM and ROM) and external storage devices of the computer, and a variety of other computer readable media.

Figure 2:
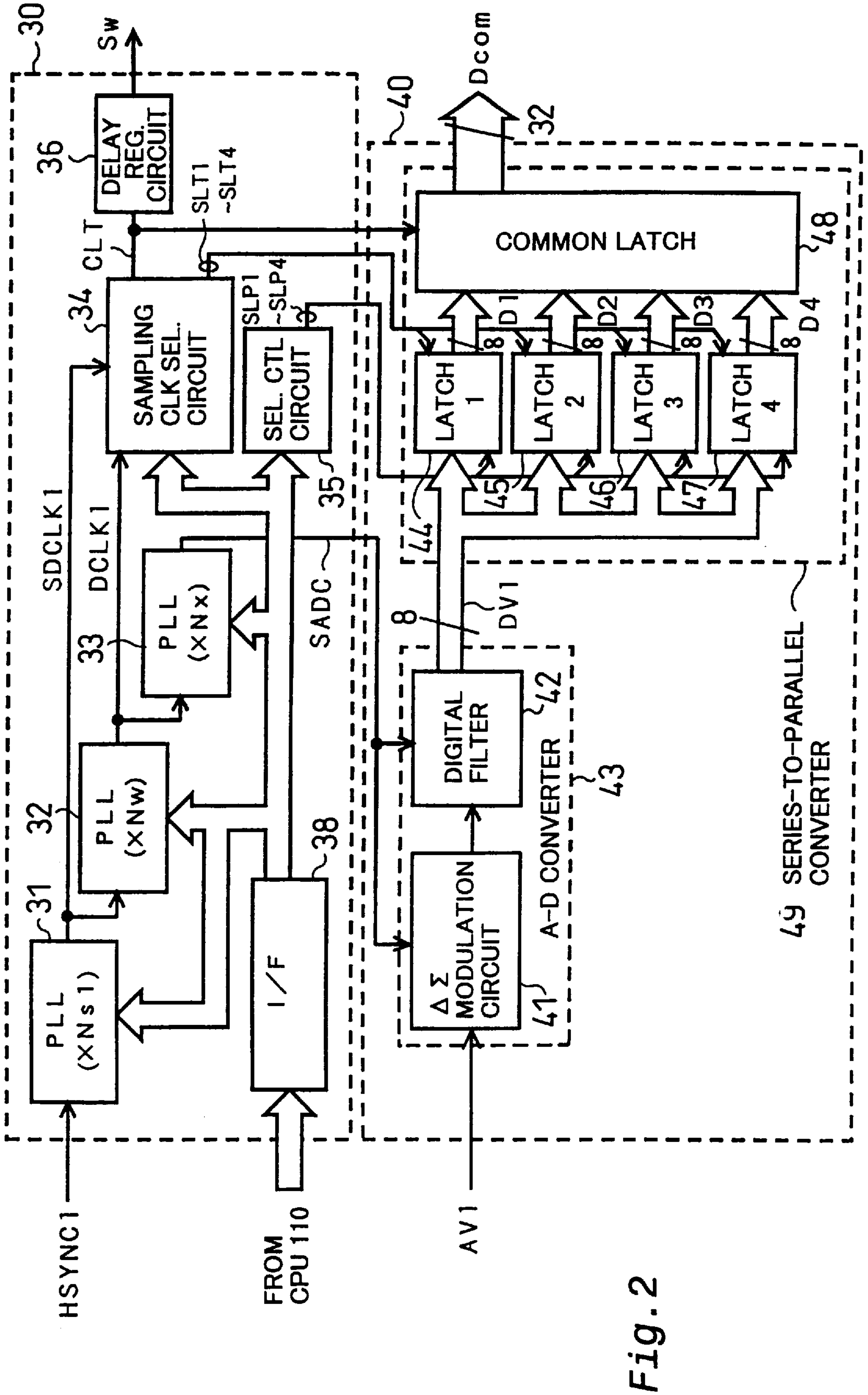
FIG. 2 is a block diagram illustrating the internal structure of the write sampling dock generator 30 and one of the A-D conversion units 40.

FIG. 2 is a block diagram illustrating the internal structure of the write sampling clock generator 30 and one of the A-D conversion units 40. The write sampling clock generator 30 includes three PLL circuits 31, 32, and 33, a sampling clock selection circuit 34, a selection control circuit 35, a delay regulation circuit 36, and a CPU interface circuit 38. The A-D conversion unit 40 includes an A-D converter 43 having a ΔΣ modulation circuit 41 and a digital filter 42, and a series-to-parallel converter 49 having four latches 44 through 47 and a common latch 48, which latches the signals transmitted from the four latches 44 through 47 at an identical ting.

Figure 3:
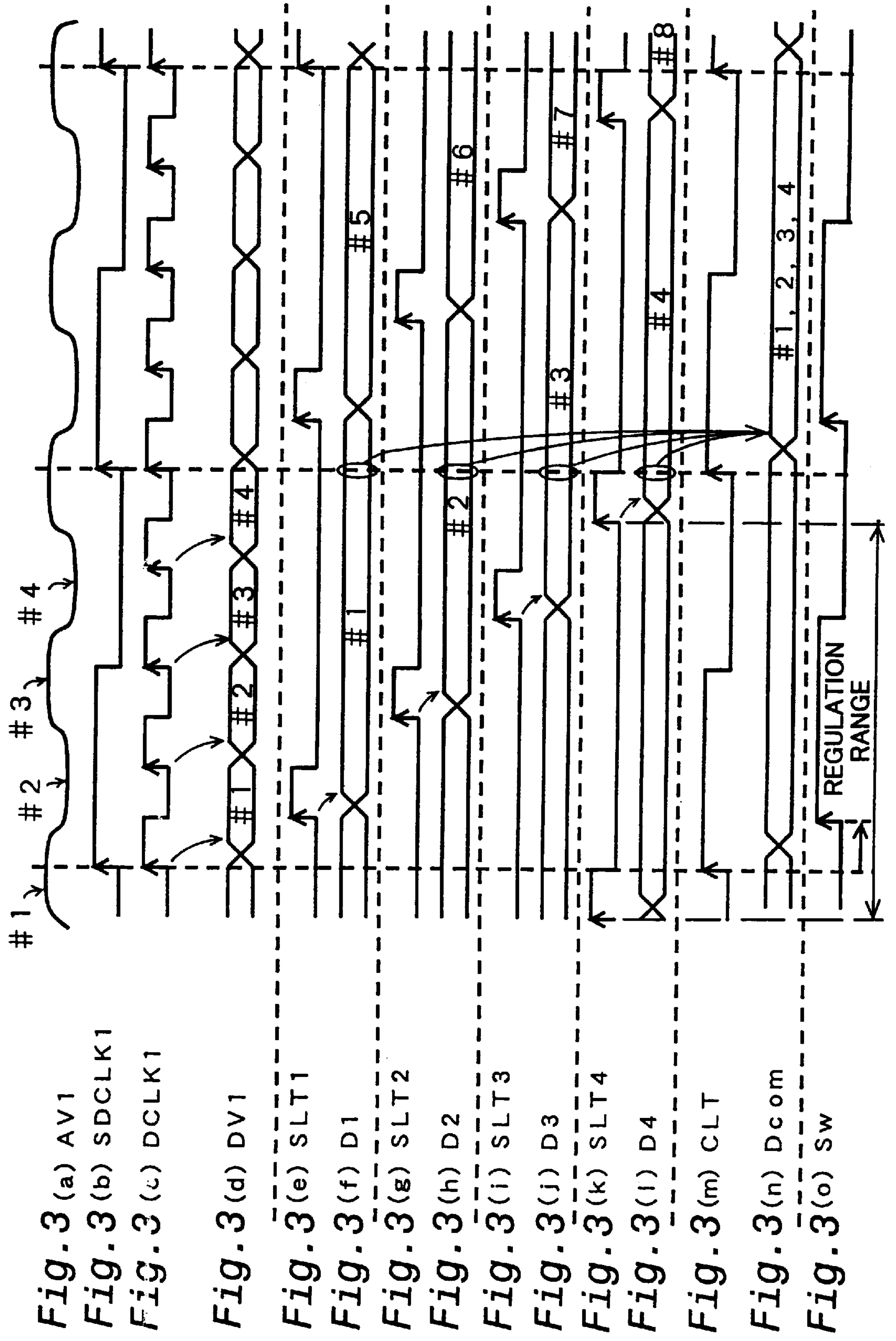
FIGS. 3(*a*) through 3(*o*) are timing charts showing primary signals relating to a writing operation of an image signal.

FIGS. 3(*a*) through 3(*o*) are timing charts showing primary signals relating to a writing operation of an image signal. The following describes the operation of the circuit shown in FIG. 2 with the timing charts of FIGS. 3(*a*) through 3(*o*).

The first PLL circuit 31 in the write sampling clock generator 30 multiplies the horizontal syncbronizng signal HSYNC1 transmitted from the synchrouizing signal separation circuit 20 (see FIG. 1) by Ns1, so as to generate a write reference clock signal SDCLK1, which is employed as a reference of the writing operation in the image processing apparatus. The second PLL circuit 32 further multiplies the write reference dock signal SDCLK1 by Nw, so as to generate a dot clock signal DCLK1. The third PLL circuit 33 further multiplies the dot dock signal DCLK1 by Nx, so as to generate a quantized sampling signal SADC used for A-D conversion in the A-D converter 43. FIGS. 3(*a*) through 3(*d*) show the waveforms of the analog image signal AV1 input into the A-D converter 43, the write reference clock signal SDCLK1, the dot dock signal DCLK1, and an A-D converted digital image signal DV1. The signal level of the analog image signal AV1 shown in FIG. 3(*a*) has one peak at every pixel Symbols #1 through #4 denote four pixels that are present on one horizontal line. The dot clock signal DCLK1 shown in FIG. 3(*c*) has the frequency and the phase suitable for sampling the analog image signal AV1. In the A-D converter 43 (see FIG. 2), the ΔΣ modulation circuit 41 over-samples the analog image signal AV1 with the quantized sampling signal SADC, which is obtained by multiplying the dot dock signal DCLK1 by Nx. The digital filter 42 then processes and converts the over-sampled quantized data into digital pixel signals corresponding to the respective pixels #1, #2, #3, #4, and outputs the digital image signal DV1 that is synchronous with a rising edge of the dot clock signal DCLK1. The term 'over-sampling' means that the signal is sampled with a clock signal having a higher frequency than the frequency of the dot clock signal. Frame memory 50 may be constructed of three memories to be written three color image signals.

The digital image signal DV1 includes a plurality of digital pixel signals that are arrayed in time series in the sequence of the pixels #1, #2, #3, #4. When the dot clock signal DCLK1 has a very high frequency, it is required to dependently enhance the processing speed of the various processing systems (circuits) that execute the various image processing operations, such as the writing operation, carried out via the video processor 60 (see FIG. 1). The processing speed of each circuit, however, depends upon the performances of the devices that constitute the circuit. In some cases, such dependency makes it difficult to enhance the processing speed. As discussed below, even when the dot clock signal DCLK1 has a very high frequency, the arrangement of this embodiment enables the image processing operations to be carried out via the video processor 60 at the frequency that is a fraction of the frequency of the dot clock signal DCLK1.

The frequency of the dot clock signal DCLK1 is determined according to the resolution of the input image. The frequency of the dot clock signal DCLK1 is, however, not restricted to the frequency that depends upon the resolution of the input image. For example, when the resolution of the image processed by the image processing apparatus is half the frequency of the input image, the frequency of the dot clock signal DCLK1 may be half the frequency determined according to the resolution of the input image.

The write reference clock signal SDCLK1 shown in FIG. 3(*b*) is synchronous with the synchronizing signal HSYNC1 of the input analog image signal AV1 and has the frequency that is 1/Nw of the frequency of the dot clock signal DCLK1, where Nw is the multiplier of the second PLL circuit 32. The multiplier Nw of the second PLL circuit 32 is generally set equal to the total number of the latches 44 through 47. In the case of FIG. 2, the multiplier Nw is set equal to 4.

The sampling clock selection circuit 34 generates four latch dock signals SLT1 through SLT4, which will be given to the four latches 44 through 47, and a common latch clock signal CLT, which will be given to the common latch 48, from the dot dock signal DCLK1 and the write reference clock signal SDCLK1. FIGS. 3(*e*), 3(*g*), 3(*i*), and 30) show the waveforms of the four latch clock signals SLT1 through SLT4. The four latch clock signals SLT1 through SLT4 have the same frequency as that of the write reference dock signal SDCLK1 and the phases mutually shifted by ¼ of the period of the write reference clock signal SDCLK1 (that is, by every period of the dot dock signal DCLK1). The sampling clock selection circuit 34 successively selects and outputs the pulses out of the dot clock signal DCLK1 at the ratio of 1 pulse to 4 pulses, and thereby generates the four latch clock signals SLT1 through SLT4 FIG. 3(*m*) shows the waveform of the common latch clock signal CLT. The common latch clock signal CLT has the same frequency as that of the write reference clock signal SDCLK1 and a rising edge in a time period between a rising edge of the fourth latch clock signal SLT4 and a rising edge of the first latch clock signal SLT1. The write reference dock signal SDCL1 may be utilized as the common latch clock signal CLT. The common latch dock signal CLT may otherwise be generated by delaying the write reference dock signal SDCLK1 to have a rising edge in a time period between a rising edge of the fourth latch dock signal SLT4 and a rising edge of the first latch dock signal SLT1.

Referring to FIG. 2, the digital image signal DV1 is commonly input into the four latches 44 through 47, whereas the four latch clock signals SLT1 through SLT4 are respectively supplied to the four latches 44 through 47. The first latch 44 latches the digital image signal DV1 at a rising edge of the first latch clock signal SLT1. FIG. 3(*f*) shows the state, in which the digital pixel signal corresponding to the first pixel #1 is latched at a rising edge of the first latch clock signal SLT1 and output as a digital image signal D1 from the first latch 44. In a similar manner, FIG. 3(*h*) shows the state, in which the digital pixel signal corresponding to the second pixel #2 is latched at a rising edge of the second latch clock signal SLT2 and output as a digital image signal D2 from the second latch 45. FIG. 3(*j*) shows the state, in which the digital pixel signal corresponding to the third pixel #3 is latched at a rising edge of the third latch dock signal SLT3 and output as a digital image signal D3 from the third latch 46. FIG. 3(*l*) shows the state, in which the digital pixel sign corresponding to the fourth pixel #4 is latched at a rising edge of the fourth latch clock signal SLT4 and output as a digital image signal D4 from the fourth latch 47.

The digital image signals D1 through D4 with respect to the four pixels thus obtained are input into the common latch 48. The common latch 48 latches the digital image signals D1 through D4 of the four pixels at a rising edge of the common latch signal CLT. FIG. 3(*n*) shows the state, in which the common latch 48 outputs the latched digital image signals D1 through D4 (8 bits×4) with respect to four pixels (each digital pixel signal corresponding to one pixel is 8-bit signal) as one set of digital image signals Dcom.

As described previously, the series-to-parallel converter 49 having the four latches 44 through 47 and the common latch 48 converts the digital image signal DV1, which is supplied synchronously with a rising edge of the dot clock signal DCLK1, into one set of 32-bit digital image signals Dcom with respect to four pixels, synchronously with the write reference dock signal SDCUK1 having the frequency that is ¼ of the frequency of the dot dock signal DCLK1.

As shown in FIGS. 3(*k*) and 3(*m*), the delay regulation circuit 36 regulates the phase of the rising edge of the common latch signal CLT (or the write reference clock signal SDCLK1) in a time period between one rising edge and a subsequent rising edge of the latch clock signal SLT4, generates a write sampling clok signal Sw that is used to ensure sampling of the digital image signals Dcom via the video processor 60, and transmits the write sampling clock signal Sw to the video processor 60. The video processor 60 utilizes the write sampling clock signal Sw to securely sample the digital image signals Dcom As shown in FIG. 1, the image processing apparatus of this embodiment has three A-D conversion units 40 corresponding to three color signals. All the A-D conversion units 40 are operated in the same manner. Each A-D conversion unit 40 accordingly outputs one set of 32-bit digital image signals Dcom with respect to four pixels of each color signal.

The digital image signals Dcom are written into consecutive storage areas in the frame memory 50. This writing operation is carried out synchronously with the write sampling clock signal Sw (FIG. 3(*o*)). One set of digital image signals Dcom corresponding to four pixels have 32 bits per one color signal. The total is thus 96 bits, which corresponds to 12 bytes. The video processor 60 accordingly increases the write address or the pixel address given to the frame memory 50 by 12 on every writing operation. When each writing of the digital image signals with respect to one line is concluded, the line address is incremented by one and the pixel address is initialized The digital image signals with respect to all the pixels on the respective lines are accordingly written into the consecutive storage areas in the frame memory 50. In other words, 24 bit image signals for one pixel including the three color components, R, G, and B are arranged in the sequence of the original pixel array in the original image and stored in the frame memory 50. The digital image signals with respect to all the pixels on an identical line are stored at the consecutive addresses in the frame memory 50. This arrangement facilitates reading the digital image signals at arbitrary positions from the frame memory 50. The frame memory 50 may consist of three memories, in which component image signals of three colors can be written separately. In this case, the component image signals of three color are written into consecutive memory areas in the respective memories.

In the write sampling clock generator 30 shown in FIG. 2, the second PLL circuit 32 generates the dot clock signal DCLK1 suitable for sampling all the analog image signal AV1, whereas the first PLL circuit 31 generates the write reference clock signal SDCLK1 having the frequency that is ¼ of the frequency of the dot clock signal DCLK1. The sampling clock selection circuit 34 generates the four latch dock signals SLT1 through SLT4 having the frequency that is ¼ of the frequency of the dot clock signal DCLK1 and the phases mutually shifted by every period of the dot dock signal DCLK1. As clearly understood from this explanation, the second PLL circuit 32 shown m FIG. 2 corresponds to the first dot clock generation circuit of the present invention. The first PLL circuit 31, the sampling clock selection circuit 34, the delay regulation circuit 36, and the third PLL circuit 33 correspond to the first sampling clock generation circuit, the second sampling clock generation circuit, the third sampling lock generation circuit, and the fourth sampling clock generation circuit of the present invention, respectively.

The latches 44 through 47 and the common latch 48 shown in FIG. 2 repeats the latch operation at the frequency of the latch clock signals SLT1 through SLT4 and the common latch clock signal CLT, that is, at the frequency of the write reference dock signal SDCLK1. This arrangement carries out the conversion at the relatively low speed of ¼ of the speed of the latch operation that is carried out synchronously with the dot clock signal DCLK1. The image processing operations carried out via the video processor 60 (FIG. 1), for example, a writing operation into the frame memory 50, are executed by writing one set of digital image signals Dcom output from the series-to-parallel converter 49 into the consecutive storage areas in the frame memory 50. Namely such image processing operations are carried out at the frequency that is ¼ of the frequency of the dot clock signal DCLK1. In this embodiment, the processing of the A-D converted image signals is cared out at the frequency that is ¼ of the frequency of the dot dock signal DCLK1. The arrangement of this embodiment thus advantageously utilizes a relatively low-speed hardware circuit to process the high-frequency analog image signals.

In the circuit structure of FIG. 2, only the sampling clock selection circuit 34 and the A-D converter 43 are activated in response to the high-frequency signals, that is, the dot dock signal DCLK1 and the quantized sampling signal SADC. In the circuit structure of this embodiment, the required number of circuit elements activated at the high frequency is minimized. This arrangement allows the relatively simple circuit structure and reduces power consumption.

It is preferable that the write sampling dock generator 30 and at least one A-D conversion unit 40 shown in FIG. 2 are constructed as an integrated circuit arranged in one package. Installing these blocks as the integrated circuit in one package causes the high-frequency signals, such as the dot clock signal DCLK1 and the quantized sampling signal SADC, to be present only inside one integrated circuit and thereby effectively reduces the noises and inappropriate operations occurring in the image processing apparatus due to such high-frequency signals. This arrangement also enables the highly dense arrangement of the constituents and reduces the whole size of the image processing apparatus.

In this embodiment, the A-D converter 43 included in the A-D conversion unit 40 has the ΔΣ modulator 41 and the digital filter 42 and carries out the over-sampling with the quantized sampling signal SADC having the higher frequency than that of the dot dock signal DCLK1. The A-D converter may have a conventional system that carries out A-D conversion with the dot clock signal DCLK1. The A-D converter of the over-sampling type is, however, smaller in size than the conventional A-D converters and ensures the high-speed A-D conversion with a high accuracy, so that the over-sampling A-D converter is advantageously actualized as the integrated circuit.

The write control signal regulator 122 sets the parameters, such as the multipliers Ns1, Nw, and Nx of the PLL circuits 31, 32, and 33, in a register (not shown) in the CPU interface circuit 38. The multiplier Nw of the second PLL circuit 32 is specified to make the frequency of the write reference dock signal SDCLK1 not greater than the processing speed that allows writing into the frame memory 50, based on the relationship between the frequency of the dot clock signal DCLK1 and the processing speed that allows writing into the frame memory 50. For example, it is assumed that the frequency of the dot dock signal DCLK1 is 300 MHz and the frequency of the write reference clock signal SDCLK1 is to be not greater than 80 MHz. In this ease, the multiplier Nw is set equal to the number of the latches 44 through 47 mounted (Nw=4). When the frequency of the dot clock signal DCLK1 is sufficiently low and one to three latches are enough for the processing, it is not required to use all the four latches 44 through 47. In such a case, activation of the non-required circuit results in wasteful consumption of the non-required power.

In this embodiment with the four latches 44 through 47, when the frequency of the latch dock signals SLT1 through SLT4 becomes equal to or lower than a preset value, for example, 20 MHz, the selection control circuit 35 outputs sleep signals SLP1 through SLP4 to suspend the operation of some of the four latches 44 through 47 based on the conditions set by the CPU interface circuit 38. For example, when it is required to use only the three latches 44, 45, and 46, the sleep signal SLP4 is given to the fourth latch 47 to suspend the operation thereof At this time, the multiplier Nw of the second P1L circuit 32 is set equal to the number of the latches (=3), whereas the multiplier Ns1 of the first PLL circuit 31 is set equal to Nw0/Nw (=4/3) times the original multiplier, where NwO denotes the total number of the latches. The first PLL circuit 31 accordingly generates the write reference clock signal SDCLK1 having the frequency that is Nw0/Nw (=4/3) times the originally multiplied frequency. The second PLL circuit 32 then generates the dot clock signal DCLK1 having the same frequency as the originally multiplied frequency.

The horizontal synchronizing signal HSYNC1 and the vertical synchronizing signal VSYNC1 extracted from the input analog image signal AV1 have natural frequencies, phase relations, and signal polarities according to the resolution of the image. One preferable structure thus stores information, which relates to the synchronzing signals corresponding to a primary set of resolutions of the image, in advance m the form of a table into the memory or the like. The number determination circuit 140 analyzes the synchronizing signals separated by the synchronizing signal separation circuit 20 (see FIG. 1). The structure then reads the frequency of the analog image signal AV1 (that is, the dot clock signal DCLK1) corresponding to the analyzed synchronizing signal from the table stored in the memory. The number Nw of the latches is determined according to the relationship between the processible frequency of the digital image signals Dcom output from the series-to-parallel conversion circuit and the frequency of the dot clock signal DCLK1. This structure ensures automatically processing of the first analog image signal having a wide frequency range from a relatively low frequency to a very high frequency.

Figure 4:
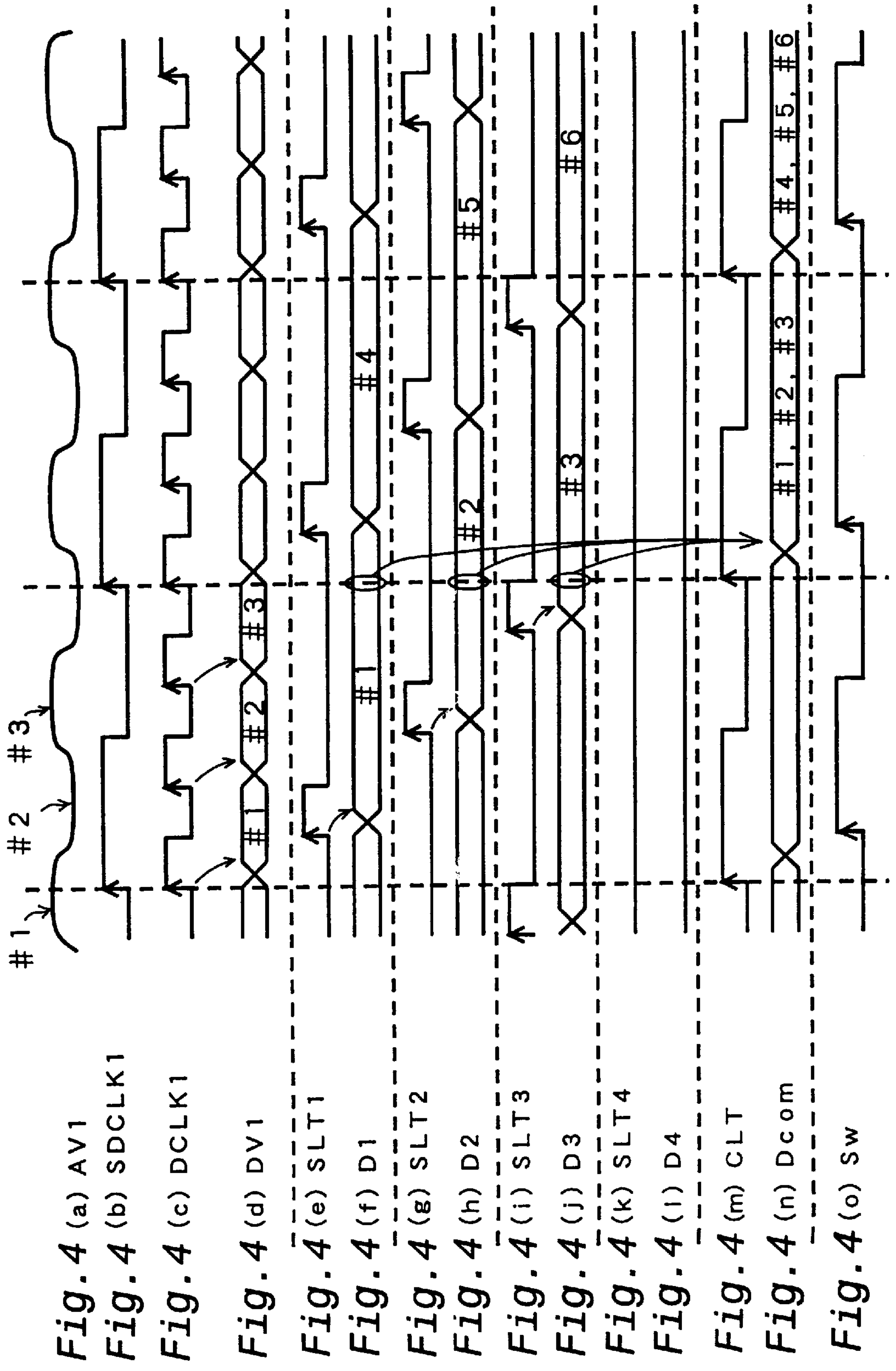
FIGS. 4(*a*) through 4(*o*) are timing charts showing primary signals relating to a writing operation in the case where the operation of the latch 47 is suspended.

FIGS. 4(*a*) through 4(*o*) are timing charts showing primary signals relating to a writing operation in the case where the operation of the latch 47 is suspended. FIGS. 4(*a*) through 4(*o*) show the similar signals to those of FIGS. 3(*a*) through 3(*o*), and are not described in detail here. The write reference clock signal SDCLK1 shown in FIG. 4(*b*) has the frequency that is ⅓ of the frequency of the dot clock signal DCLK1 shown in FIGS. 4(*c*). As shown in FIGS. 4(*e*), 4(*g*), and 4(*i*), the three latch clock signals SLT1 through SLT3 have the same frequency as that of the write reference clock signal SDCLK1 and the phases mutually shifted by ⅓ of the period of the write reference clock signal SDCLK1 (that is, by every period of the dot clock signal DCLK1). As shown in FIG. 4(*k*), on the other hand, the latch clock signal SLT4 generates no pulses. This suspends the operation of the fourth latch 47. The series-to-parallel converter 49 then converts the digital image signal DV1 output from the A-D converter 43 into one set of 24-bit (8 bits×3) digital image signals Dcom corresponding to three pixels as shown in FIG. 4(*n*).

The write control signal regulator 122 has the function of regulating the number Nw of the latches 44 through 47 (where Nw ranges from 1 to 4) determined by the number determination circuit 140, in order to enable the latch clock signals SLT1 through SLT4 supplied to the latches 44 through 47 via the CPU interface circuit 38 to have a frequency in a predetermined range (for example, in a range of about 20 MHz to about 100 MHz). This arrangement ensures automatically processing of the analog image signal having a wide frequency range from a relatively low frequency to a very high frequency, and enables selection of the specific operation mode, in which the power consumption is reduced. A variety of methods may be adopted to suspend the operation of some latches. One method stops a supply of the latch clock signal to the corresponding latch, and another method stops a supply of electric power to the corresponding latch.

Figure 5:
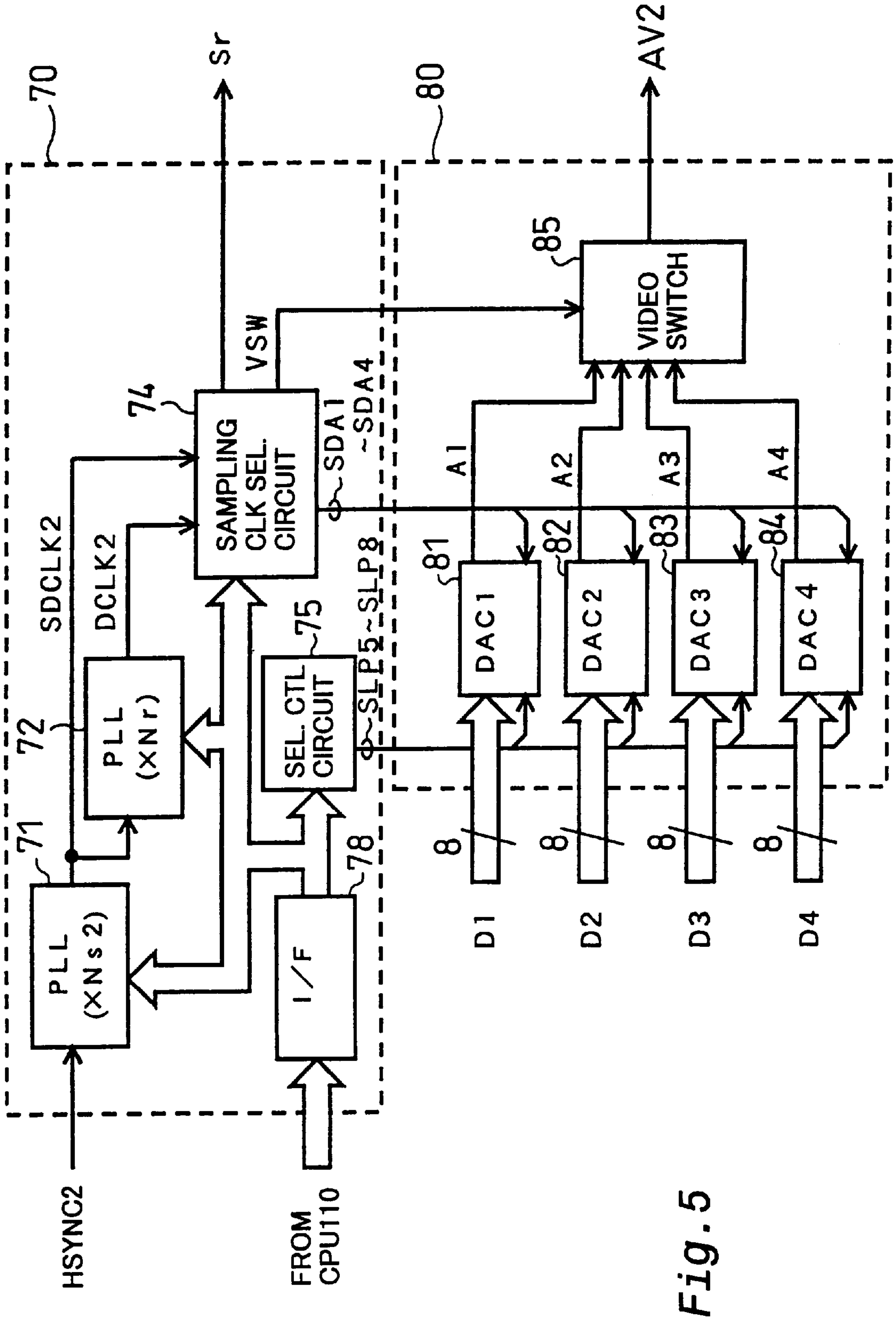
FIG. 5 is a block diagram illustrating the internal structure of the read sampling dock generator 70 and one of the D-A conversion units 80.

The digital image signals stored in the frame memory 50 are read out by the video processor 60 and converted into analog image signals by the three D-A conversion units 80, which respectively correspond to the three color signals R, G, and B. FIG. 5 is a block diagram illustrating the internal structure of the read sampling clock generator 70 and one of the D-A conversion units 80. The read sampling clock generator 70 includes two PLL circuits 71 and 72, a sampling clock selection circuit 74, a selection control circuit 75, and a CPU interface circuit 78. The read sampling clock generator 70 has a similar structure to that of the write sampling dock generator 30 shown in FIG. 2. The difference is that the read sampling dock generator 70 does not have a PLL circuit corresponding to the third PLL circuit 33 shown in FIG. 2. The D-A conversion unit 80 includes four D-A converters 81 through 84.

In the read sampling dock generator 70, the first PLL circuit 71 multiplies the horizontal synchronizing signal HSYNC2 output from the display control circuit 90 (see FIG. 1) by Ns2, so as to generate a read reference dock signal SDCLK2. The second PIL circuit 72 further multiplies the read reference clock signal SDCLK2 by Nr, so as to generate a dot lock signal DCLK1. The sampling clock selection circuit 74 generates four sampling dock signals SDA1 through SDA4, which will be supplied to the four D-A converters 81 through 84, from the dot clock signal DCLK2 and the read reference clock signal SDCLK2.

The relations of the frequencies and phases of the signals SDCLK2, DCLK2, and SDA1 through SDA4 generated in the read sampling clock generator 70 are substantially similar to the relations of the frequencies and phases of the signals SDCLK1, DCLK1, and SLT1 through SLT4 generated in the write sampling clock generator 30 (see FIG. 2). The dot clock signal DCLK2 has the frequency and the phase suitable for sampling the analog image signal AV2 given to the display unit 100. The frequency of the dot dock signal DCLK2 depends upon the type of the display unit 100. The frequency of the read reference clock signal SDCLK2 is 1/Nr of the frequency of the dot dock signal DCLK2. This value Nr (the multiplier of the PLL circuit 72) is generally set equal to the total number of the D-A converters 81 through 84 mounted in the D-Aconversion unit 80. The four sampling clock signals SDA1 through SDA4 have the frequency that is 1/Nr of the frequency of the dot clock signal DLCK2 and the phases that are mutually shifted by ¼ of the period of the read reference dock signal SDCLK2 (that is, by every period of the dot clock signal DCLK2). As dearly understood from this explanation, the first PLL circuit 71 and the second PLL circuit 72 shown in FIG. 5 correspond to the second dot dock generation circuit of the present invention. The first PLL circuit 71 and the sampling dock selection circuit 74 respectively correspond to the fifth sampling clock generation circuit and the sixth sampling clock generation circuit of the present invention.

The four D-A converters 81 through 84 carry out D-A conversion of the digital image signals D1 through D4 at respective rising edges of the four sampling clock signals SDA through SDA4. The D-A conversion converts the digital image signals D1 through D4 input at the respective rising edges of the input sampling dock signals SDA1 through SDA4 into voltages including weights relative to a preset reference voltage. The D-A conversion, for example, converts the digital image signals D1 through D4 with respect to the four consecutive pixels into four analog image signals A1 through A4 having phases shifted from one another. These four analog image signals A1 through A4 are then input into a video switch 85. The video switch 85 carries out switching operations to successively select and output the four analog image signals A1 through A4 in response to a switch signal VSW, which is synchronous with the dot clock signal DCLK2. The switch signal VSW is generated by the sampling dot selection circuit 74. The video switch 85 accordingly outputs the analog image signal AV2 that represents an image having the sequence of the original pixel array. The analog image signals A1 through A4 output from the respective D-A converters 81 through 84 form the respective parts of the resulting analog image signal AV2 and are thereby referred to as 'partial analog image signals'.

As descibed above, in the image processing apparatus of this embodiment, the reading operation from the frame memory 50 and the D-A conversion are carried out at the frequency that is 1/Nr of the frequency of the dot clock signal DCLK2. The arrangement of this embodiment advantageously utilizes a relatively low-speed hardware circuit to output the high-frequency analog image signal AV2. Only the sampling clock selection circuit 74 and the video switch 85 are activated in response to the high-frequency dot dock signal DCLK2. In the circuit structure of this embodiment, the required number of circuit elements activated at the high frequency is minimized. This arrangement allows the relatively simple circuit structure and saves the power consumption The read control signal regulator 124 (see FIG. 1) sets the number Nr of the D-A converters (that is equal to the multiplier of the PLL circuit 72) in the CPU interface circuit 78 of the read sampling clock generator 70. The CPU interface circuit 78 sets the multipliers Ns2 and Nr of the PLL circuits 71 and 72 according to the number Nr of the D-A converters, and sets the conditions for ceasing the operations of some of the D-A converters 81 through 84 according to the requirements in the selection control circuit 75. The selection control circuit 75 generates sleep signals SLP5 through SLP8 based on the preset conditions. For example, the sleep signal SLP8 is supplied to the D-A converter 84, in order to suspend the operation of the D-A converter 84. An alternative process stops generation of pulses of the sampling lock signal SDA4. This effectively reduces the power consumption due to the non-required D-A conversion.

As described previously, the digital image signals with respect to all the pixels on an identical line are stored at the consecutive addresses in the frame memory 50. This enables digital image signals at arbitrary positions to be read from the frame memory 50. The number Nw of the latches included in the series-to-parallel converter 49 (see FIG. 2) and the number Nr of the D-A converters used may be set independently of each other. The total number of mounted latches and the total number of mounted D-A converters may also be specified independently of each other.

B. Second Embodiment

Figure 6:
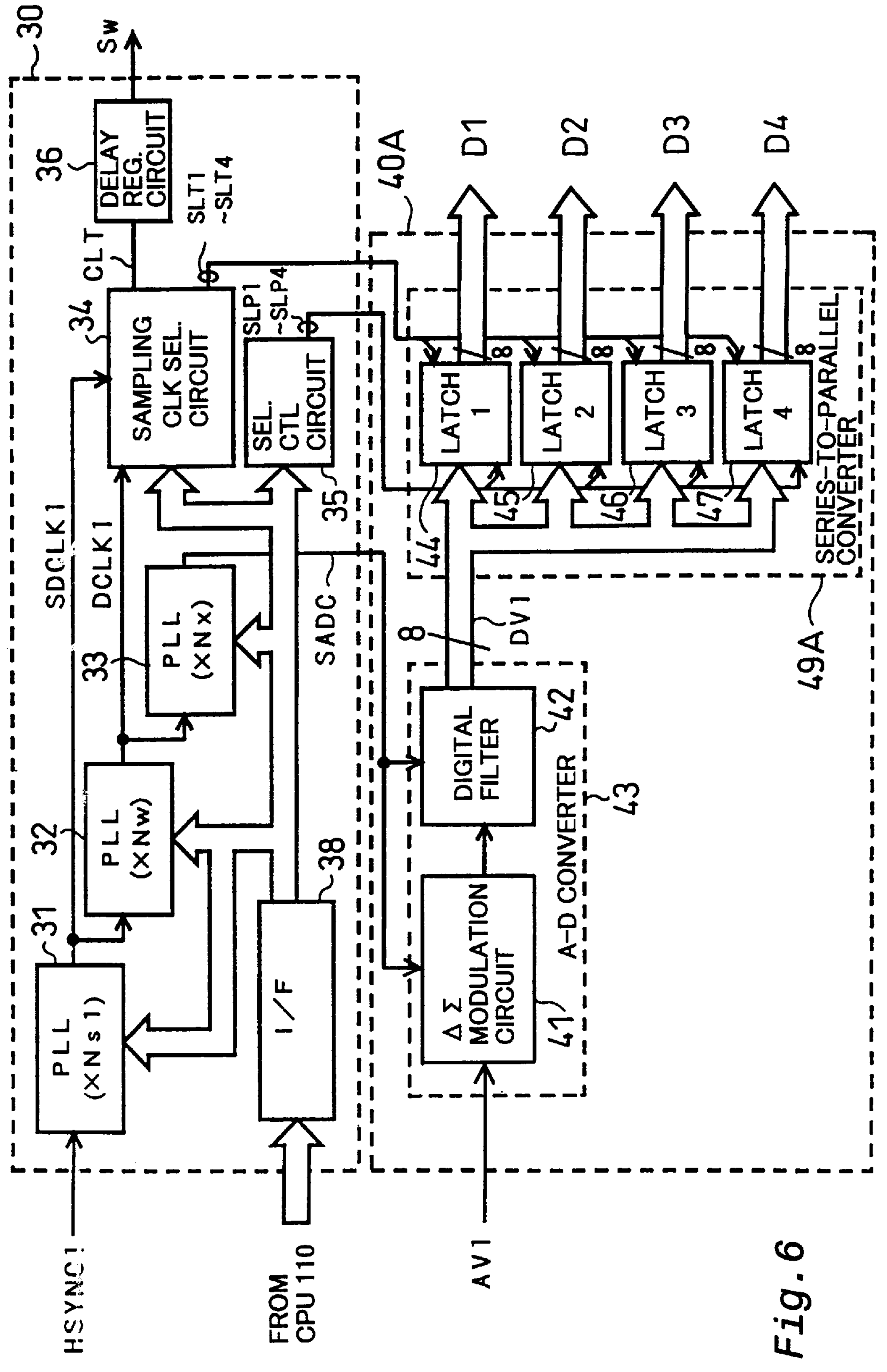
FIG. 6 is a block diagram illustrating the internal structure of the write sampling clock generator 30 and an A-D conversion unit 40A in a second embodiment according to the present invention, FIGS. 7(*a*) through 7(*o*) are timing charts of primary signals relating to the writing operation of image signals in the A-D conversion unit 40A.

FIG. 6 is a block diagram illustrating the internal structure of the write sampling clock generator 30 and an A-D conversion unit 40A in a second embodiment according to the present invention. The general structure of the image processing apparatus of the second embodiment is substantially similar to that of the first embodiment, except that the A-D conversion limits 40 in FIG. 1 are replaced by the A-D conversion units 40A, and is thereby not specifically described here.

The A-D conversion unit 40A has a series-to-parallel converter 49A, in place of the series-to-parallel converter 49 included in the A-D conversion unit 40 shown in FIG. 2. The common latch 48 of the series-to-parallel converter 49 may not be included in the A-D conversion unit 40. For example, the common latch 48 may be disposed at the input side of the video processor 60 (see FIG. 1). The series-to-parallel converter 49A has no common latch 48 included in the series-to-parallel converter 49. The following describes the delay regulation process carried out in the delay regulation circuit 36, which is modified due to the omission of the common latch 48. The description of the other functions is omitted here.

Figure 7:
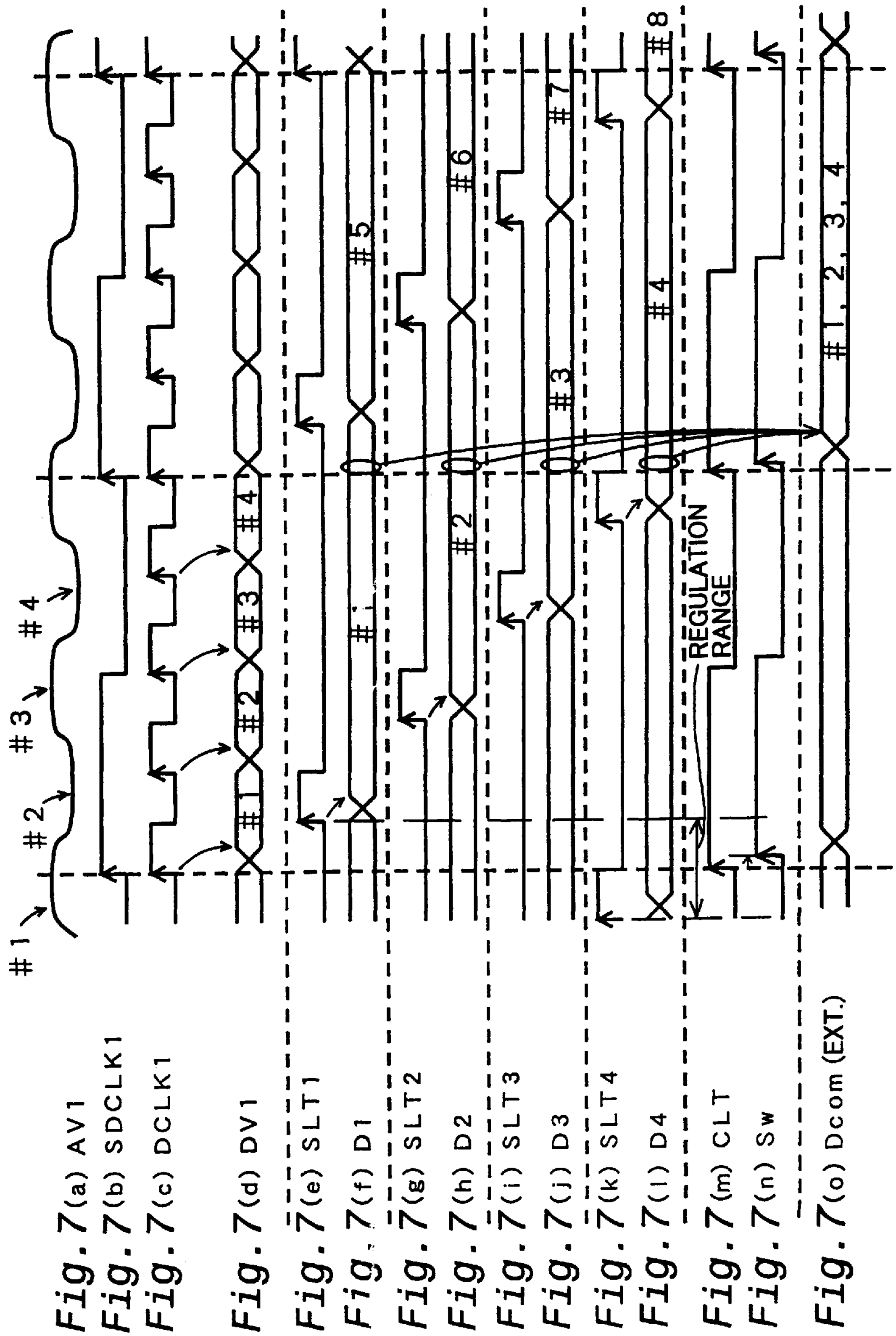

FIGS. 7(*a*) through 7(*o*) are timing charts showing primary signals relating to a writing operation of an image signal in the A-D conversion unit 40A Digital image signals D1 through D4 (see FIGS. 7(*i*), 7(*h*), 70), and 7(*l*)) with respect to four pixels output from the A-D conversion unit 40A are obtained by latching a digital image signal DV1 (see FIG. 7(*d*)) in response to four latch clock signals SLT1 through SLT4 (see FIGS. 7(*e*), 7*g*, 7(*i*), and 7(*k*)). These four latch dock signals SLT1 through SLT4 have the same frequency as that of the write reference clock signal SDCLK1 and the phases mutually shifted by ¼ of the period of the write reference clock signal SDCLK1 (that is, by every period of the dot clock signal DCLK1). The digital image signals D1 through D4 with respect to four pixels output from the A-D conversion unit 40A are updated at every period of the latch clock signals SLT1 through SLT4, respectively In order to ensure processing of the digital image signals D1 through D4 with respect to four pixels via the video processor 60 (see FIG. 1), it is here required to sample the digital image signals D1 through D4 with respect to four pixels after the digital image signals D1 through D4 have been latched in response to the latch clock signals SLT1 through SLT4 but before a next digital image signal D1 is latched. As shown in FIG. 7(*n*), it is thus preferable that the phase of a rising edge of the write sampling clock signal Sw is regulated to be in the time period between a ring edge of the latch clock signal SLT4 and a rising edge of the latch clock signal SLT1. The delay regulation circuit 36 (see FIG. 6) regulates the rising edge of the common latch signal CLT (or the write reference clock signal SDCLK1) to generate the write sampling clock signal Sw. This arrangement utilizes the write sampling dock signal Sw and enables the common latch 48 disposed on the input side of the video processor 60 to securely sample the digital image signals D1 through D4 with respect to four pixels.

C. Third Embodiment

Figure 8:
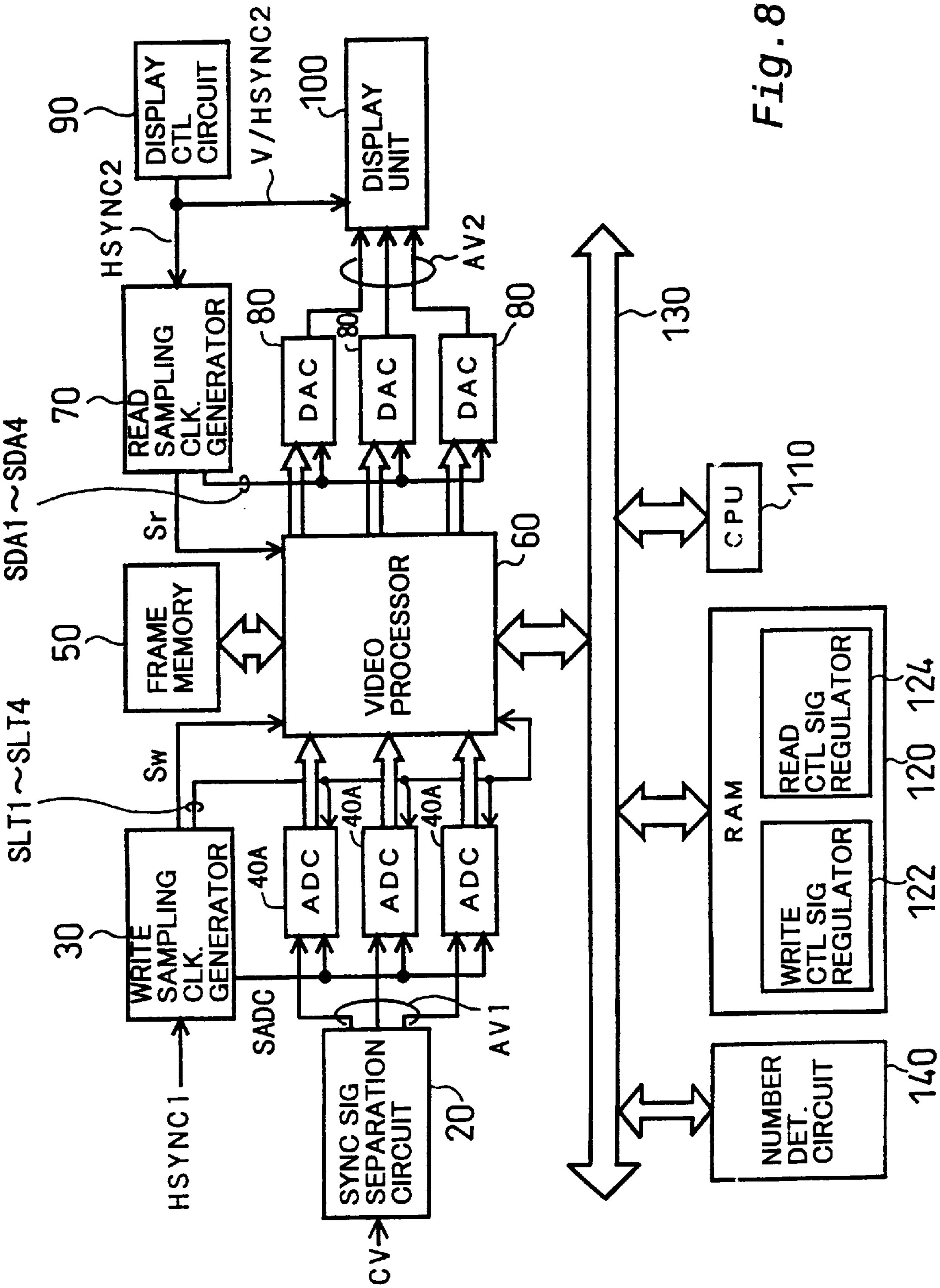
FIG. 8 is a block diagram illustrating the general structure of an image processing apparatus in a third embodiment according to the present invention.

FIG. 8 is a block diagram illustrating the general structure of an image processing apparatus in a third embodiment according to the present invention. The structure of this image processing apparatus is substantially similar to the structure of the first embodiment shown in FIG. 1, except that the A-D conversion unit 40 is replaced by the A-D conversion unit 40A shown in FIG. 6 and that the latch clock signals SLT1 through SLT4 are also supplied to the video processor 60.

As discussed in the second embodiment, the digital image signals D1 through D4 output from the A-D conversion unit 40A (see FIG. 6) are latched at rising edges of the latch clock signals SLT1 through SLT4 in the four latches 44 through 47 included in the series-to-parallel converter 49A The stable sampling can be attained in the video processor 60 by utilizing the latch clock signals SLT1 through SLT4 for sampling of the digital image signals D1 through D4.

D. Fourth Embodiment

Figure 9:
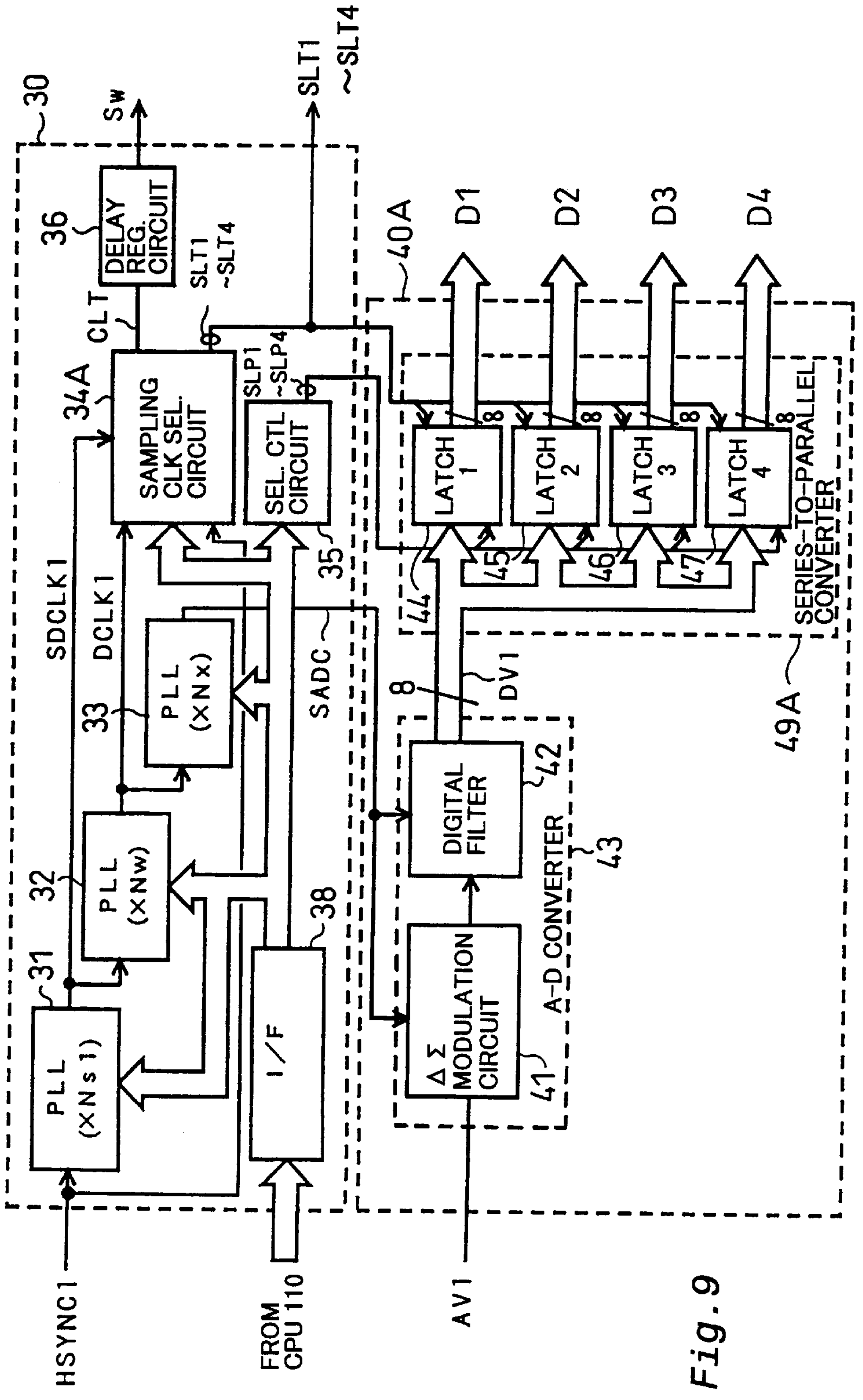
FIG. 9 is a block diagram illustrating the internal structure of a write sampling dock generator 30A and the A-D conversion unit 40A in a fourth embodiment according to the present invention.

FIG. 9 is a block diagram illustrating the internal structure of a write sampling clock generator 30A and the A-D conversion unit 40A in a fourth embodiment according to the present invention. The general structure of the image processing apparatus in the fourth embodiment is substantially similar to that of the third embodiment shown in FIG. 8, except that the write sampling clock generator 30 is replaced by the write sampling dock generator 30A, and is thus not specifically described here.

The write sampling clock generator 30A has a similar structure to that of the write sampling dock generator 30 shown in FIG. 2, except that the sampling clock selection circuit 34 is replaced by a sampling clock selection circuit 34A. The A-D conversion unit 40A has the structure shown in FIG. 6.

A dot dock signal DCLK1 as well as a write reference clock signal SDCLK1 and a horizontal synchronizing signal HSYNC1 are input into the sampling dock selection circuit 34A of this embodiment.

Figure 10:
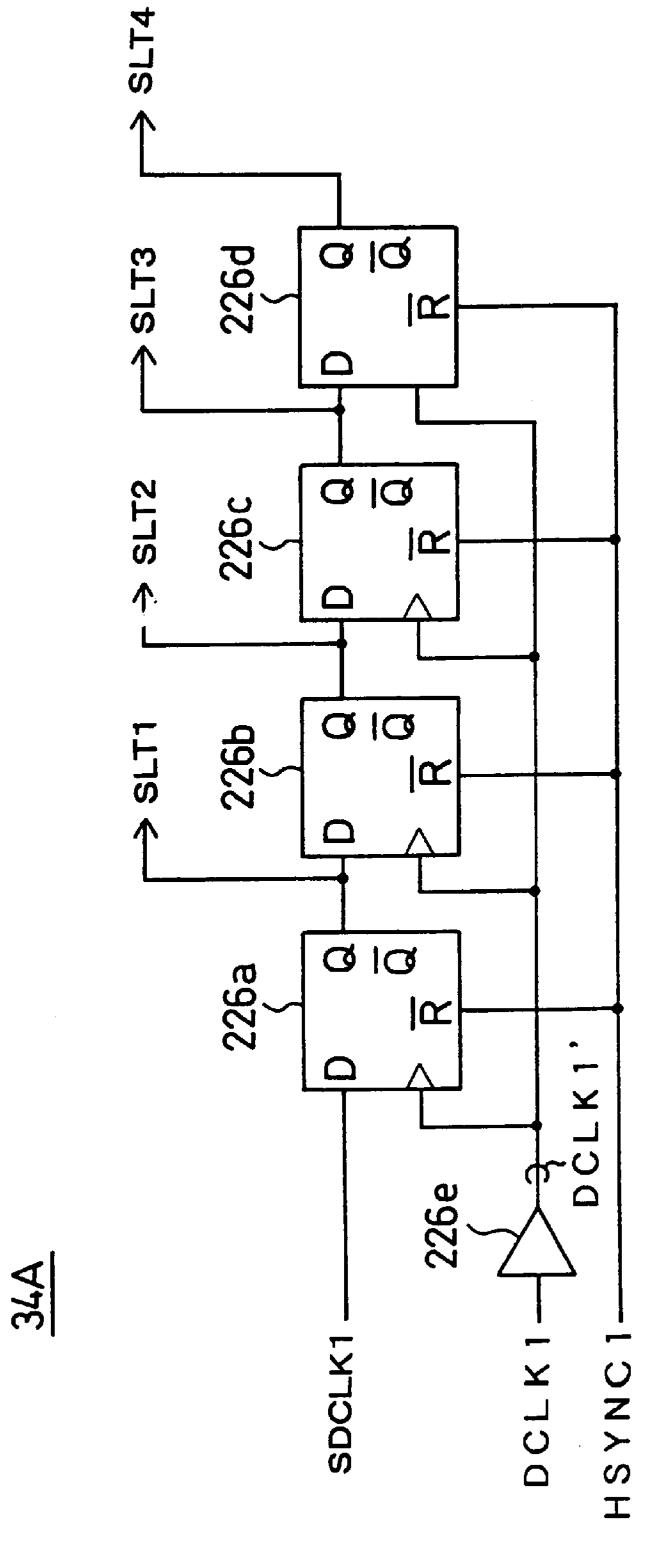
FIG. 10 is a circuit diagram showing an example of the sampling clock selection circuit 34A.

FIG. 10 is a circuit diagram showing an example of the sampling dock selection circuit 34A. The sampling clock selection circuit 34A has a shift register including four D flip-flops 226*a* through 226*d* and a delay circuit 226*e*. The write reference dock signal SDCLK1 is input into a data input terminal of the first D flip-flop 226*a*. The dot dock signal DCLK1 is input into the delay circuit 22*e*. A dot clock signal DCLK1' output from the delay circuit 226*e* is commonly input into dock terminals of the four D flip-flops 226*a* through 226*d*. The horizontal synchronizing signal HSYNC1 is commonly input into reset terminals of the four D flip-flops 226*a* through 226*d*.

Figures 11A, 11B, 11C, 11D, 11E, 11F, 11G:
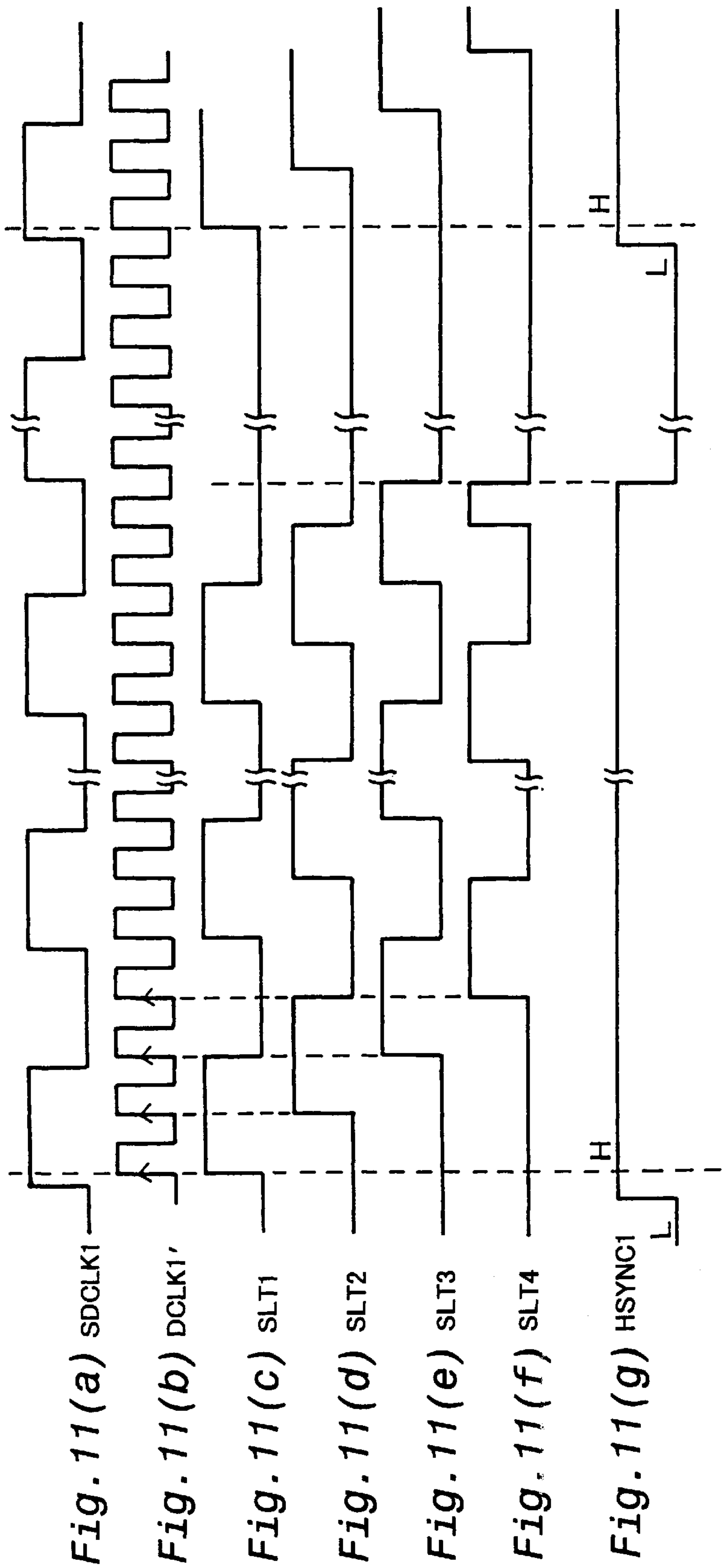
FIGS. 11(*a*) through 11(*g*) are timing charts showing the operations of the sampling clock selection circuit 34A.

FIGS. 11(*a*) through 11(*g*) are timing charts showing operations of the sampling clock selection circuit 34A The operations of the sampling dock selection circuit 34A are discussed below with the timing charts of FIGS. 11(*a*)

through 11(*g*). The first D flip-flop 226*a* (see FIG. 10) samples the write reference clock signal SDLCK1 input from the data input terminal at a rising edge of the dot clock signal DCLK1' and outputs a first latch dock signal SLT1. FIGS. 11(*a*) through 11(*c*) show the waveforms of the write reference dock signal SDCLK1, the dot clock signal DCLK1', and the first latch dock signal SLT1. The second D flip-flop 226*b* samples the first latch dock signal SLT1 (FIG. 11(*c*)) output from the D flip-flop 226*a* in response to the dot dock signal DCLK1' and outputs a second latch dock signal SLT2. In a similar manner, the D flip-flops 226*c* and 226*d* respectively output a third latch dock signal SLT3 and a fourth latch clock signal SLT4. FIGS. 11(*d*) through 11(*f*) show the waveforms of the latch clock signals SLT2 through SLT4. The sampling dock selection circuit 34A outputs the four latch clock signals SLT1 through SLT4 (FIGS. 11(*c*) through 11(*f*)) that are successively different in phase by 90 degrees in the above manner.

The D flip-flops 226*a* through 226*d* change the respective output signals SLT1 through SLT4 to the L level in response to an input of the L level into the respective reset terminals. When the H level is input into the respective reset terminals, on the other hand, the D flip-flops 226*a* through 226*d* are revived from the reset state and restart the above operations to output the latch dock signals SLT1 through SLT4. The use of the horizontal synchronizing signal HSYNC1 as shown in FIG. 11(*g*) as the reset signal of the D flip-flops enables the horizontal synchronizing signal HSYNC1 and the four latch dock signals SLT1 through SLT4 to keep a predetermined phase relation.

When these latch cock signals SLT1 through SLT4 are supplied to the latches 44 through 47 (see FIG. 9), the image signal of the first pixel on each horizontal line is always sampled by the first latch 44. In the event that no reset operation is earned out with the horizontal synchronzing signal HSYNC1, arbitrary latch may sample the image signal of the first pixel that is present on each horizontal line, and the sampling latch may be changed by every horizontal line. In the arrangement of this embodiment, on the other hand, the sampling latch is fixed to the first latch 44. The reset signal is not restricted to the horizontal synchronizing signal HSYNC1 shown in FIG. 11(*g*) but may be another signal having pulses that are generated at a predetermined phase relation to the pulses of the horizontal synchronzing signal HSYNC1.

FIGS. 12(*a*) through 12(*i*) are timing charts showing the output of digital image signals D1 through D4 in this embodiment. FIGS. 12(*a*) through 12(*c*) show the waveforms of the horizontal synchronizing signal HSYNC1, the write reference clock signal SDCLK1, and the dot clock signal DCLK1. FIG. 12(*d*) shows the waveform of a digital image signal DV1 output from the A-D converter 43 (see FIG. 9). An analog image signal AV1 input into the A-D converter 43 is converted into the digital image signal DV1, which is output synchronously with a rising edge of the dot clock signal DCLK1 (ig. 12(*c*)). The digital image signal DV1 is commonly input into the four latches 44 through 47 and held in response to the latch clock signals SLT1 through SLT4. Four digital image signals D1 through D4 held in the latches 44 through 47 are output as data that are successively different in phase by 90 degrees. FIGS. 12(*e*) through 12(*h*) show the waveforms of the latch clock signals SLT1 through SLT4, and FIGS. 12(*i*) through 12(*l*) show the waveforms of the digital image signals D1 through D4 output in response to the latch clock signals SLT1 through SLT4.

FIGS. 12(*a*) through 12(*i*) show the case in which the latch clock signals SLT1 through SLT4 are respectively supplied to the latches 44 through 47 and the sampling operation (latch operation) is carried out in the sequence of the latches 44, 45, 46, and 47. The sequence of the latch operation may be varied by changing the latches to which the four latch clock signals SLT1 through SLT4 are respectively supplied.

In this embodiment, the latch clock signals SLT1 through SLT4 have substantially identical lengths of the high-level period and the low-level period, although they are not restricted to this waveform. For example, the ratio of the high-level period to the low-level period may be 1 to 7 as shown in the first embodiment. The only requirement is that the rising edges of the latch clock signals SLT1 through SLT4, which respectively specify the sampling (latch) timings of the latches 44 through 47, have the phases that are successively shifted by 90 degrees. The waveforms of the latch dock signals SLT1 through SLT4 are readily modified by u the dot clock signal DCLK1, the write reference clock signal SDLCK1, and the like. Such modification of the waveforms can also be implemented in the other embodiments.

This embodiment regards the internal structure of the write sampling dock generator 30A This internal structure is also applicable to the read sampling clock generator 70.

E. Fifth Embodiment

Figure 13:
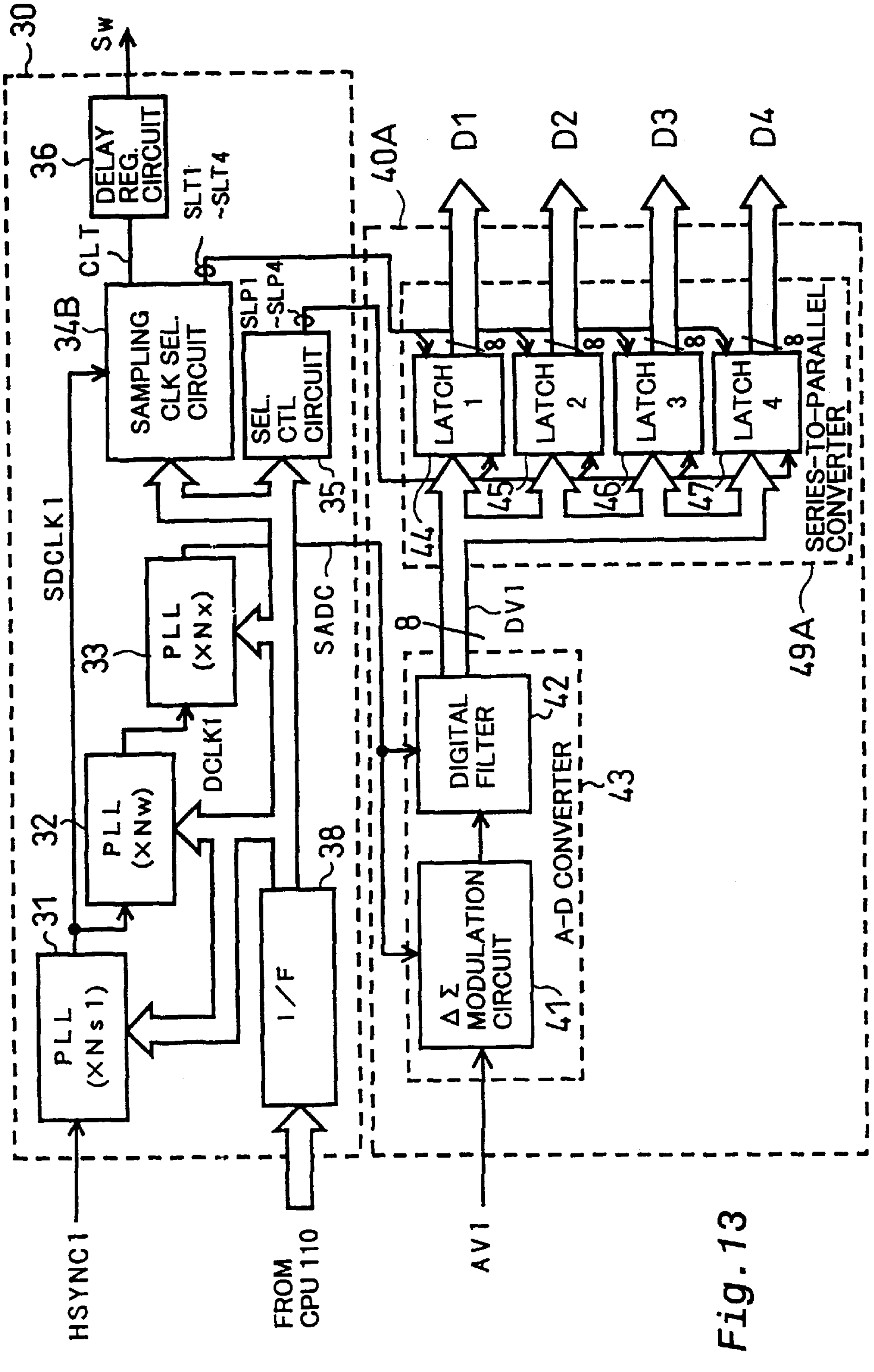
FIG. 13 is a block diagram illustrating the internal structure of a write sampling dock generator 30B and the A-D conversion unit 40A in a fifth embodiment according to the present invention.

FIG. 13 is a block diagram illustrating the internal structure of a write sampling clock generator 30B and the A-D conversion unit 40A in a fifth embodiment according to the present invention. The general structure of the image processing apparatus in the fifth embodiment is substantially similar to that of the third embodiment shown in FIG. 8, except that the write sampling dock generator 30 is replaced by the write sampling clock generator 30B, and is thus not specifically described here.

The write sampling dock generator 30B has a similar structure to that of the write sampling clock generator 30 shown in FIG. 2, except that the sampling dock selection circuit 34 is replaced by a sampling dock selection circuit 34B. The A-D conversion unit 40A has the structure shown in FIG. 6.

Figure 14:
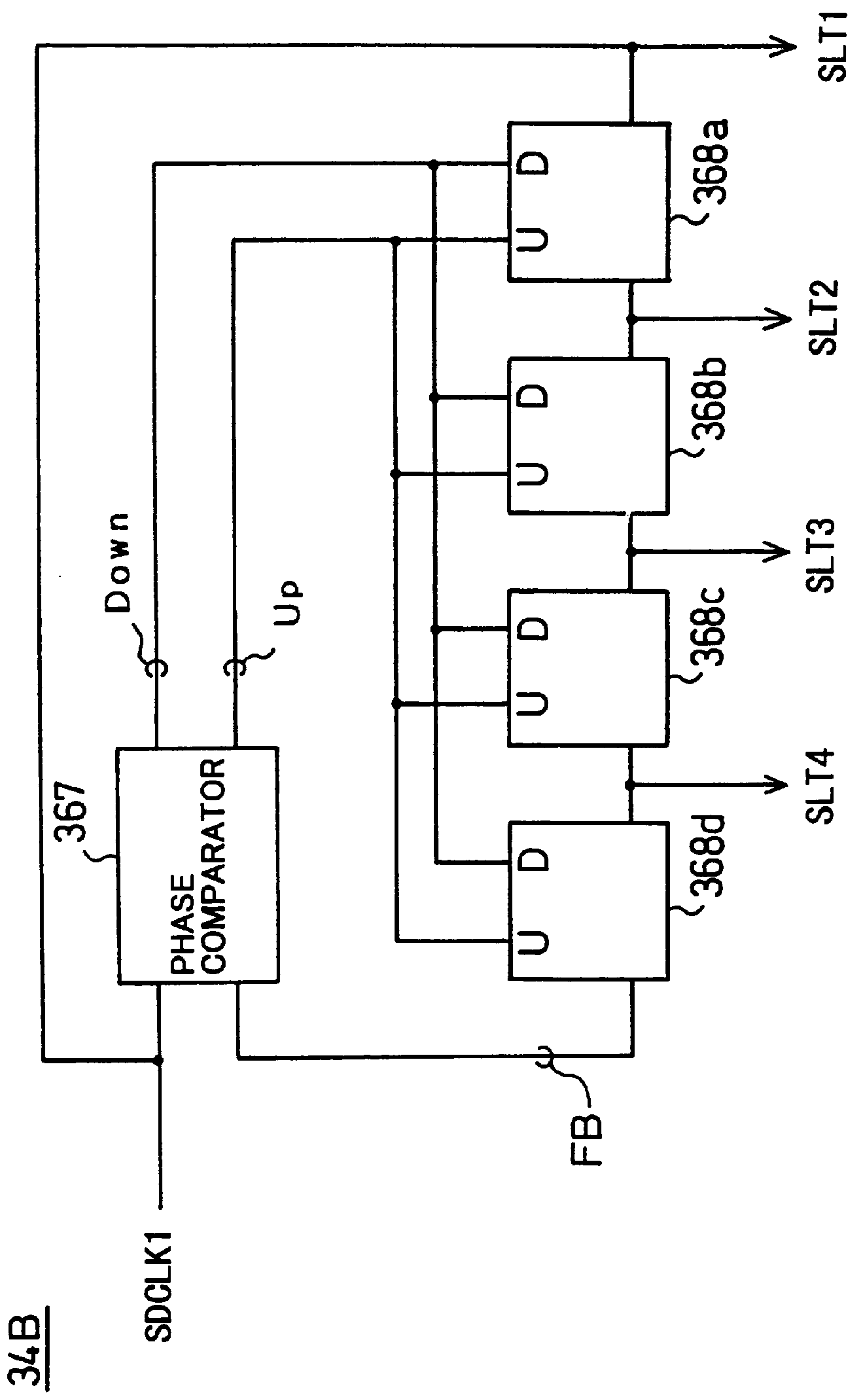
FIG. 14 is a block diagram illustrating the internal structure of the sampling clock selection circuit 34B.

FIG. 14 is a block diagram illustrating the internal structure of the sampling dock selection circuit 34B. The sampling clock selection circuit 34B has a phase comparator 367 and four delay circuits 368*a* through 368*d*. Each of the delay circuits 368*a* through 368*d* includes an up-down counter and a delay regulation circuit (not shown). The delay regulation circuit may be constructed, for example, as a plurality of delay regulation buffers connected in series.

The phase comparator 367 is a circuit that compares the phases of two input signals and outputs an up-down signal corresponding to the phase difference. The phase comparator 367 receives the write reference clock signal SDCLK1 output from the PLL circuit 31 (see FIG. 13) and a feedback signal FB output from the delay circuit 368*d*.

The up-down counter incorporated in each of the delay circuits 368*a* through 368*d* varies its output in response to the up-down signal output from the phase comparator 367. The delay regulation circuit regulates the quantity of delay using the output of the counter. For example, in the case of an increment of the counter output in response to the up signal, the number of the delay regulation buffers used is increased to make the quantity of delay greater. In the case of a decrement of the counter output in response to the down signal, on the contrary, the number of the delay regulation buffers is decreased to make the quantity of delay smaller. In this manner, the quantity of delay is regulated in the four delay circuits 368*a* through 368*d*.

The write reference clock signal SDCLK1 input into the delay circuit 368*a* asses through the four delay circuits 368*a* through 368*d* and is output to the phase comparator 367 as the feedback signal FB, which is delayed by substantially one cycle from the write reference clock signal SDCLK1. The phase comparator 367 again outputs the up-down signal according to the phase difference between the two signals SDCLK1 and FB. After the regulation of the phases of these two signals SDCLK1 and FB, the write reference dock signal SDCLK1 and the three signals output from the delay circuits 368*a* through 366*c* are output as latch clock signals SLT1 through SLT4 from the sampling clock selection circuit 34B. The latch clock signals SLT1 through SLT4 have the phases that are successively shifted by 90 degrees.

Although the write reference clock signal SDCLK1 is utilized as the latch clock signal SLT1 in the example of FIG. 14, the signals output from the four delay circuits 368*a* through 368*d* may be used as the sampling clock signals SLT1 through SLT4.

In this embodiment, each of the delay circuits 368*a* through 368*d* has an up-down counter. Alternatively an up-down counter may be incorporated in the phase comparator 367. This modified structure advantageously requires only one up-down counter.

The processing as discussed in the fourth embodiment may be implemented with the latch dock signals SLT1 through SLT4 thus generated. Unlike the first through the third embodiments, this embodiment does not use the high-frequency dot clock signal DCLK1 and thereby favorably reduces the power consumption of the sampling lock selection circuit 34B.

Although this embodiment regards the internal structure of the write sampling clock generator 30B, the above structure is also applicable to the read sampling clock generator 70.

F. Sixth Embodiment

Figure 15:
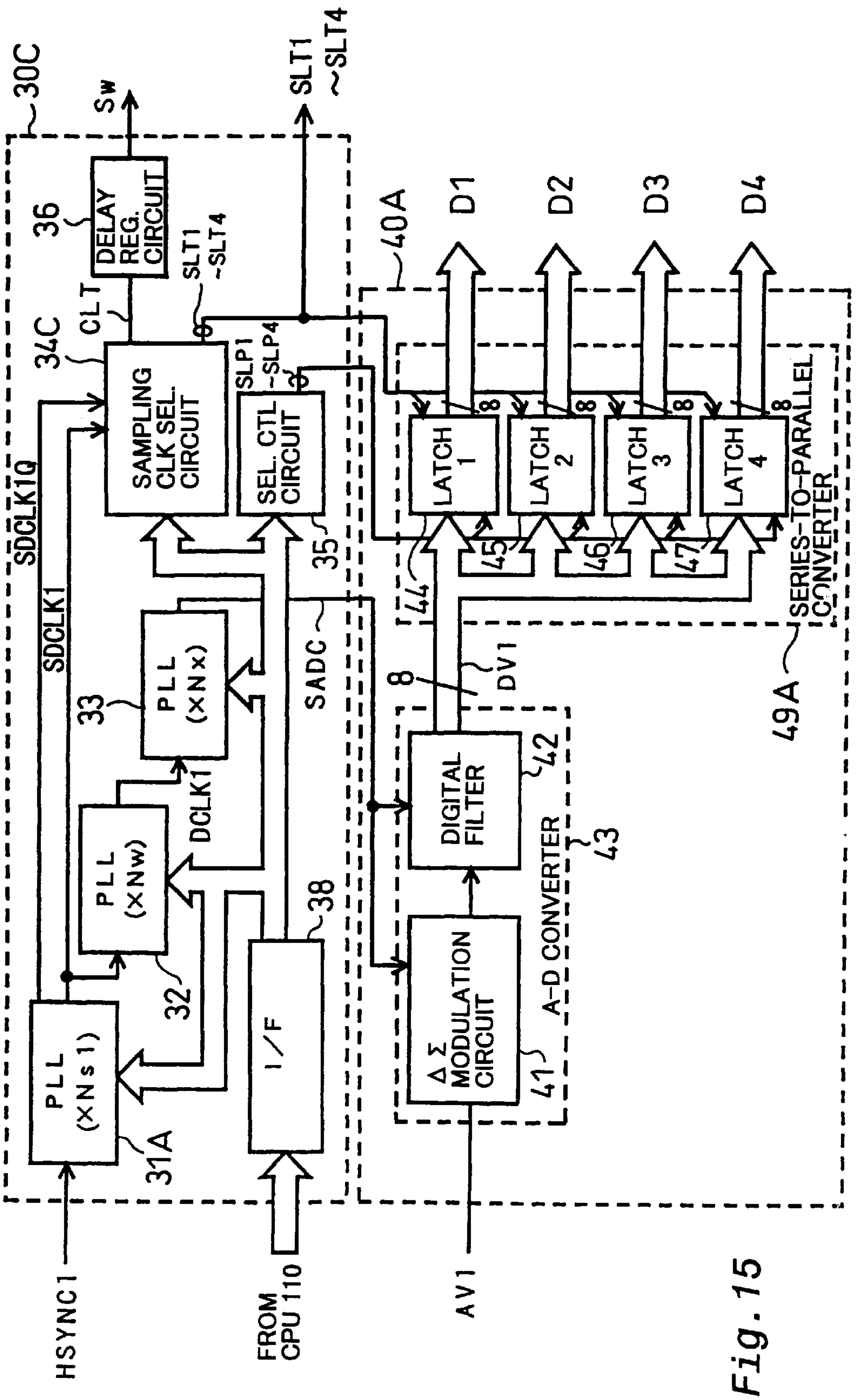
FIG. 15 is a block diagram illustrating the internal structure of a write sampling dock generator 30C and the A-D conversion unit 40A in a sixth embodiment according to the present invention.

FIG. 15 is a block diagram illustrating the internal structure of a write sampling dock generator 30C and the A-D conversion unit 40A in a sixth embodiment according to the present invention. The general structure of the image processing apparatus in the sixth embodiment is substantially similar to that of the third embodiment shown in FIG. 8, except that the write sampling clock generator 30 is replaced by the write sampling clock generator 30C, and is thus not specifically 15 described here.

The write sampling clock generator 30C has a similar structure to that of the write sampling clock generator 30 shown in FIG. 2, except that the PLL circuit 31 and the sampling clock selection circuit 34 are respectively replaced by a PLL circuit 31A and a sampling clock selection circuit 34C. The A-D conversion unit 40A has the structure shown in FIG. 6.

The first PLL circuit 31A receives the horizontal synchronizing signal HSYNC1 and outputs the write reference clock signal SDCLK1 as well as another write reference clock signal SDCLK1Q, which is different in phase by 90 degrees from the write reference clock signal SDCLK1. For example, ICS1522 manufactured by ICS Corp. may be applied for the first PLL circuit 31A.

The sampling clock selection circuit 34C receives the write reference clock signals SDCLK1 and SDCLK1Q and generates latch dock signals SLT1 through SLT4. The two write reference clock signals SDCLK1 and SDCLK1Q input into the sampling dock selection circuit 34C have the phases that are different from each other by 90 degrees. The four latch dock signals SLT1 through SLT4 having the phases that are successively shifted by 90 degrees are readily generated by inverting the two signals SDCLK1 and SDCLK1Q in the sampling clock selection circuit 34C.

In this circuit structure, the sampling dock selection circuit 34C is constructed as an inversion circuit. This arrangement simplifies the structure of the sampling dock selection circuit 34C and favorably reduces the power consumption.

Although this embodiment regards the internal structure of the write sampling clock generator 30C, the above structure is also applicable to the read sampling clock generator 70.

G. Seventh Embodiment

Figure 16:
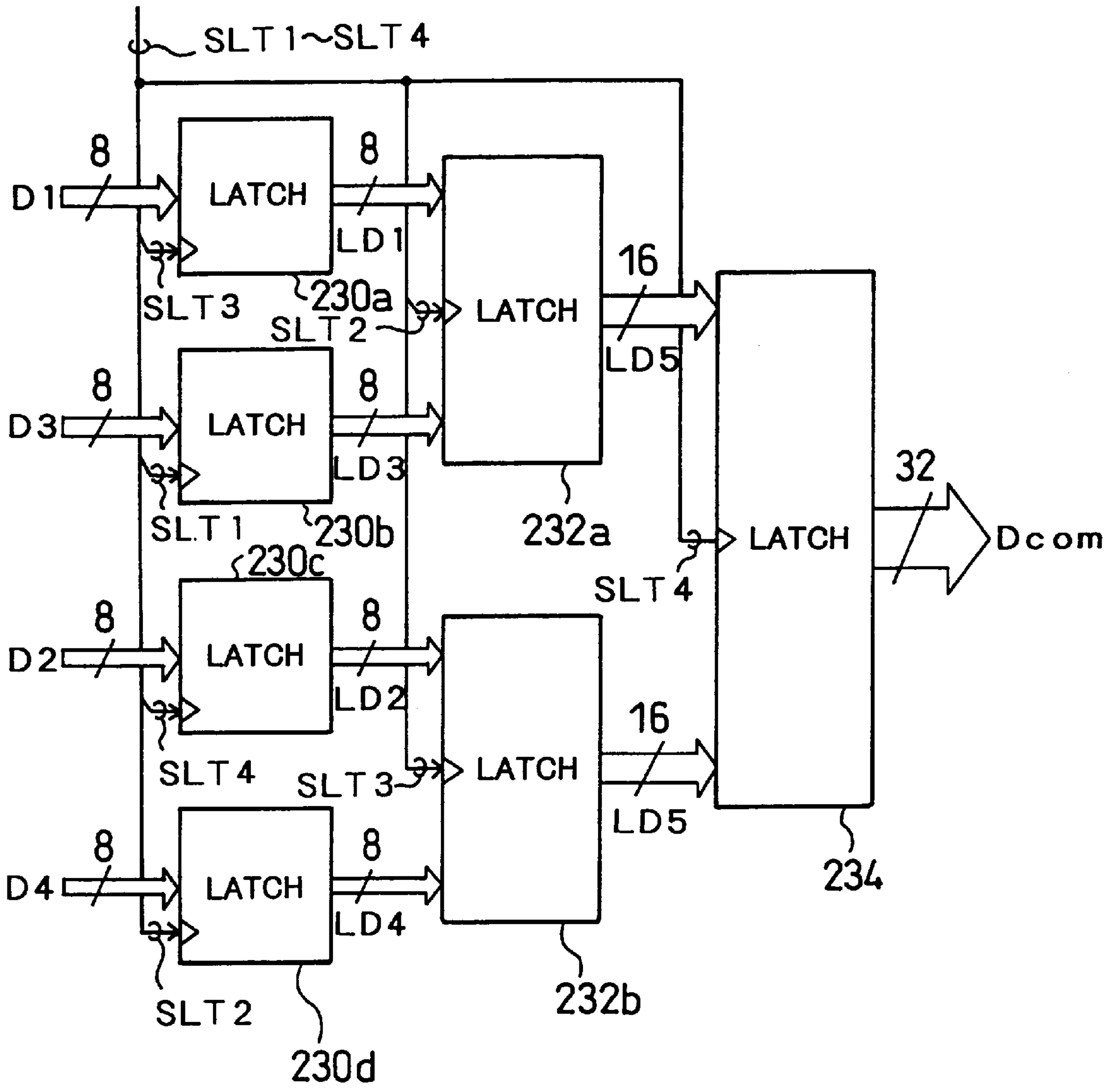
FIG. 16 is a block diagram showing a multiple-stage digital image signal phase regulation circuits disposed in the interface of the video processor 60.

FIG. 16 is a block diagram showing a multiple-stage digital image signal phase regulation circuits disposed in the interface of the video processor 60 shown in FIG. 8. The multiple-stage digital image signal phase regulation circuits are provided for each set of digital image signals output from each of the three A-D conversion units 40A The multiple-stage digital image signal phase regulation circuits includes multiple stages of digital image signal phase regulation circuits and has a hierarchical structure, where the number of circuits included in each stage gradually decreases towards the last stage. Each of the plurality of digital image signal phase regulation circuits included in each stage, except the last stage, holds a plurality of input digital image signals at a predetermined phase, which is different from the phases of the other digital image signal phase regulation circuits included in the same stage, and supplies the digital image signals of the predetermined phase to a digital image signal phase regulation Bit in the next stage. The digital image signal phase regulation circuit included in the last stage holds Nw digital image signals supplied from the preceding stage at an identical phase.

The digital image signal phase regulation circuits of the respective stages are constructed as latches. Each latch receives one of the latch clock signals SLT1 through SLT4 generated by the sampling clock selection circuit 30A shown in FIG. 9.

Four latches 230*a* through 230*d* included in the first stage hold the digital image signals 1 through D4, which are output from the A-D conversion unit 40A and have the successively shifted phases, into the video processor 60. Each of two latches 232*a* and 232*b* included in a second stage combines alternate two of the four digital image signals D1 through D4, which are respectively output from the four latches in the first stage and have the successively shifted phases, into a composite digital image signal and outputs the composite digital image signal A latch 234 included in a third stage further combines the two composite digital image signals, which are output from the two latches 232*a* and 232*b* in the second stage and have different phases, into one final composite digital image signal and outputs the final composite digital image signal as a digital image signal Dcom of an identical phase.

Figures 17A, 17B, 17C, 17D, 17E, 17F, 17G, 17H, 17I, 17J, 17K, 17L, 17M, 17N, 17O, 17P:
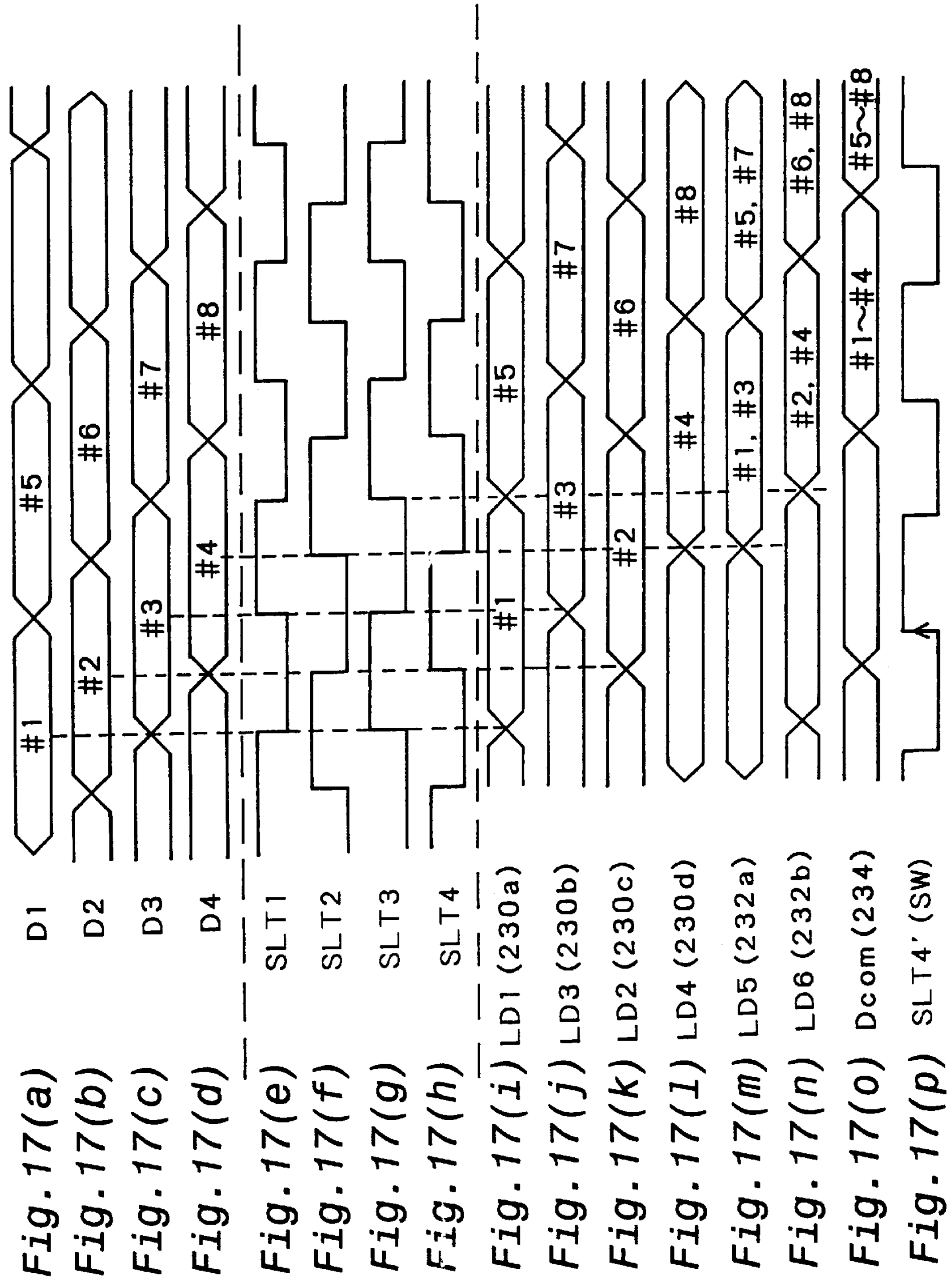
FIGS. 17(*a*) through 17(*p*) are timing charts of the digital image signals D1 through D4 processed by the multiple-stage digital image signal phase regulation circuits shown in FIG. 16.

FIGS. 17(*a*) through 17(*p*) are timing charts of the digital image signals D1 through D4 processed by the multiple-stage digital image signal phase regulation circuits shown in FIG. 16. FIGS. 17(*a*) through 17(*d*) show the four digital image signals D1 through D4 that are output from the A-D conversion unit 40A shown in FIG. 12 and have the successively shifted phases. FIGS. 17(*e*) through 17(*h*) show the waveforms of the latch clock signals SLT1 through SLT4 input into the video processor 60.

The digital image signals D1, D3, D2, and D4 are respectively input into the latches 230*a* through 230*d* included in the first stage shown in FIG. 16. The latch 230*a* samples the digital image signal D1 in response to the latch clock signal SLT3 and outputs a digital image signal LD1, which has the phase shifted by 180 degrees from the phase of the digital image signal D1. In a similar manner, the latches 230*b* through 230*d* respectively output digital image signals LD3, LD2, and LD4 in response to the latch clock signals SLT1, SLT4, and SLT2. FIGS. 17(*i*) through 17(*l*) show the digital image signals LD1, LD3, LD2, and LD4 that are respectively output from the latches 230*a* through 230*d*.

The latch 232*a* included in the second stage receives the alternate two digital image signals LD1 and LD3 among the four digital image signals LD1 through LD4 that have the successively shied phases. The latch 232*a* samples the digital image signals LD1 and LD3 at a rising edge of the latch clock signal SLT2 and outputs a digital image signal LD5 including the data of both the digital image signals LD1 and LD3. In a similar manner, the latch 232*b* samples the digital image signals LD2 and LD4 at a ring edge of the latch clock signal SLT3 and outputs a digital image signal LD1 including the data of both the digital image signals LD2 and LD4. FIGS. 17(*m*) and 17(*n*) show the digital image signals LD5 and LD6 respectively output from the latches 232*a* and 232*b*.

The latch 234 in the third stage receives the two digital image signals LD5 and LD6 having different phases. The latch 234 samples the digital image signals LD5 and LD6 at a rising edge of the latch clock signal SLT4 and outputs the digital image signal Doom (FIG. 17(*o*)) including the data of all the digital image signals LD1 through LD4. The use of the latches arranged in multiple stages enables the digital image signals D1 through D4 to be output as the digital image signal Dcom of an identical phase.

The technique of using the multiple-stage latches stages to combine some alternate signals of different phases to a composite signal of an identical phase alternate the stable sampling. In this case, a relatively large interval can be ensured between a point of data change of each digital image signal, which is the target of the combining operation, and a sampling point (that is, a rising edge of the latch clock signal) for the combining operation. This arrangement thus advantageously decreases the possibility of sampling each of the digital image signals at its point of data change. By way of example, in the case of an input of the four digital image signals D1 through D4 (FIGS. 17(*a*) through 17(*d*)) having the successively shifted phases as shown in FIG. 17, all the signals D1 through D4 are sampled at a rising edge of a signal SLT4' (FIG. 17(*p*)), which has the phase delayed by 90 degrees from the phase of the latch dock signal SLT4, and output as a signal of an identical phase. In this case, however, the intervals between the sampling point (that is, a rising edge of the latch clock signal SLT4) and the points of data change of the digital image signals D1 and D4 are as narrow as ⅛ of the period of the respective signals. On the other hand, when the multiple-stage latches as shown in FIG. 16 are used to sample alternate two of the signals having the successively shifted phases, for example, when the digital image signals LD1 and LD3 (FIGS. 17(*i*) and 17(*j*)) are sampled at a rising edge of the latch dock signal SLT2, the intervals between the sampling point (that is, a rising edge of the latch dock signal SLT2) and the points of data change of the two signals LD1 and LD4 are relatively widened to ¼ of the period of the respective signals.

In this embodiment, the latch dock signals SLT1 through SLT4 are supplied to the latches 44 through 47 as well as to the video processor 60. This enables the digital image signals D1 through D4 output from the A-D conversion unit 40A to be sampled at suitable tunings. Even if there is a variation in delay of the respective clock signals due to the working temperature, this arrangement effectively prevents the wrong operations due to the variation.

The multiple-stage digital image signal phase regulation circuits is located inside the video processor 60 in this embodiment, but may be incorporated in the A-D conversion unit 40A (see FIG. 9). Like the first embodiment, the latter configuration enables the digital image signals D1 through D4 to be output as the digital image signal Dcom of an identical phase from the A-D conversion unit 40A In this case, it is not necessary to supply all the latch clock signals SLT1 through SLT4 to the video processor 60. It is, however, preferable that at least one of the latch clock signals SLT1 through SLT4 is supplied to the video processor 60, for the purpose of sampling the digital image signal Dcom in the video processor 60.

The digital image signal Dcom taken into the video processor 60 is stored into the frame memory 50 as discussed in the first embodiment.

H. Other Possible Applications

The present invention is not restricted to the above embodiments or their modifications, but there may be many other modifications, changes, and alterations without departing from the scope or spirit of the main characteristics of the present invention. Some examples of possible modification are given below.

(1) In the embodiments discussed above, the sampling clock generator generates relatively high-frequency signals, such as the dot clock signal DCLK1 and the quantized sampling signal SADC. When the relatively high-frequency signals are transmitted through wiring on a printed board, the waveform of such signals may have a significant distance or delay It is accordingly preferable that such signals as the dot dock signal DCLK1 and the quantized sampling signal SADC are generated and utilized inside one integrated chip and not output from the integrated chip.

The above embodiments, wherein the sampling clock generator and at least one A-D conversion unit are integrated in one chip, accordingly relieve the above problem. In the event that the sampling clock generator and at least one A-D conversion unit are not integrated in one chip, it is preferable that the PLL circuits 32 and 33, the sampling clock selection circuit 34 (or 34A, 34B), and one A-D conversion unit 40 are integrated in one chip, in order to prevent the dot clock signal DCLK1 and the quantized sampling signal SADC from being output from the integrated chip.

(2) In the write sampling clock generator 30 shown in FIG. 2, the first PLL circuit 31 multiplies the horizontal synchronizing signal HSYNC1 by Ns1 to generate the write reference clock signal SDCLK1. Alternatively, the frequency of the dot clock signal DCLK1 may be divided by Nw (where Nw denotes the number of latches) to generate the write reference dock signal SDCLK1. In this case, the horizontal synchronizing signal HSYNC1 is multiplied in a single PLL circuit to produce the dot clock signal DCLK1. In other words, a variety of circuit structures, such as a PLL circuit and a frequency divider, may be adopted for the circuit to generate the write reference clock signal SDC1.

This modification may also be applicable to the circuit structure in the read sampling clock generator 70 shown in FIG. 7, which is related to generation of the read reference clock signal SDCLI and the dot clock signal DCLK2.

(3) In the above embodiment, part of the structure actualized by the hardware may be replaced by the software, and on the contrary, part of the structure actualized by the software may be replaced by the hardware.

The present invention is applicable to a variety of image processing apparatuses having the functions of A-D conversion and D-A conversion, for example, liquid-crystal projectors and other projector-type display apparatuses. The invention is also applicable not only to image display apparatuses using liquid-crystal panels but to image display apparatuses using another display, such as a CRT or a plasma display, and a variety of electronic appliances including the image display apparatuses.

What is claimed is:

1. An image processing apparatus, comprising:

a first dot dock generation circuit that generates a first dot clock signal, which is synchronous with a first synchronizing signal of a first analog image signal and has a frequency suitable for sampling the first analog image signal;

an A-D converter that quantizes the first analog image signal to convert the first analog image signal into digital image signals, and sequentially outputs the digital image signals for respective pixels sampled in synchronism with the first dot dock signal, a series-to-parallel converter having Mw signal hold circuits that sequentially hold the digital image signals with respect to Mw consecutive pixels, the series-to-parallel converter outputting in parallel the digital image signals with respect to Nw consecutive pixels, where Mw is an integer of not less than 2 and Nw is an integer of not less than 1 but not greater than Mw, Nw representing a number of signal hold circuits that are actually used;

a first sampling dock generation circuit that generates a first sampling clock signal, which is synchronous with the first synchronizing signal and has a frequency that is 1/Nw of the frequency of the first dot clock signal;

a second sampling dock generation circuit that generates Nw second sampling dock signals where Nw corresponds to the number of the signal hold circuits used, the Nw second sampling dock signals having the frequency of the first sampling dock signal and different phases that are mutually shifted by one period of the first dot dock signal and a write control signal regulator that regulates, according to the number Nw of signal hold circuits used, the operation of the first sampling clock generation circuit and the second sampling dock generation circuit and supplies the Nw second sampling clock signs to the Nw signal hold circuits, so as to cause the digital image signals with respect to the Nw consecutive pixels to be output from the series-to-parallel converter as one set of digital image signals.

2. An image processing apparatus in accordance with claim 1, further comprising:

a selective control circuit that suspends operation of (Mw-Nw) signal hold circuits which are not used, wherein the write control signal regulator controls the selective control circuit according to the number Nw.

3. An image processing apparatus in accordance with claim 2, further comprising:

a number determination circuit that determines the number Nw of the signal hold circuits used according to the frequency of the first dot clock signal.

4. An image processing apparatus in accordance with claim 1, wherein the Nw second sampling clock signals having the mutually shifted phases are output together with the one set of digital image signals from the image processing apparatus.

5. An image processing apparatus in accordance with claim 1, wherein the second sampling clock generation circuit generates the Nw second sampling clock signals having the mutually shifted phases, in response to the first sampling clock signal and the first dot clok signal.

6. An image processing apparatus in accordance with claim 1, wherein the second sampling clock generation circuit generates the Nw second sampling clock signals having the mutually shifted phases by successively delaying the first sampling clock signal.

7. An image processing apparatus in accordance with claim 1, wherein the first sampling clock generation circuit further generates a 90-degree phase shift clock signal having a phase difference of 90 degrees from the first sampling clock signal and the second sampling clock generation circuit generates the Nw second sampling clock signals having the mutually shifted phases, in response to the first sampling clock signal and the 90-degree phase shift clock signal.

8. An image processing apparatus in accordance with claim 1, wherein the second sampling clock generation circuit initializes the Nw second sampling clock signals having the mutually shifted phases, in response to the pulse of the first synchronizing signal, so that the first synchronizing signal and each of the Nw second sampling clock signals having the mutually shifted phases has a predetermined phase relation.

9. An image processing apparatus in accordance with claim 1, further comprising:

a third sampling clock generation circuit that generates a third sampling clock signal having a phase suitable for sampling the one set of digital image signals, the third sampling dock signal being output from the image processing apparatus together with the one set of digital image signals.

10. An image processing apparatus in accordance with claim 1, further comprising:

a fourth sampling clock generation circuit that generates a fourth sampling clock signal, which is synchronous with the first synchronizing signal and has a frequency that is Nx times the frequency of the first dot clock signal, where Nx is an integer of not less than 2, wherein the A-D converter comprises a $\Delta\Sigma$ modulation circuit and a digital filter, and quantizes the first analog image signal in response to the fourth sampling clock signal and sequentially outputs the digital image signals of the respective pixels sampled synchronously with the first dot clock signal.

11. An image processing apparatus in accordance with claim 1, wherein the first analog signal includes a plurality of color component signals, and wherein the A-D converter includes a plurality of A-D converter elements for the respective color component signals, and the series-to-parallel converter includes a plurality of converter elements for the respective color component signals.

12. An image processing apparatus in accordance with claim 1, wherein the series-to-parallel converter comprises:

multiple-stage digital image signal phase regulation circuits to output the Nw digital image signals at an identical phase, wherein the multiple-stage digital image signal phase regulation circuits have a hierarchical structure, where the number of circuits included in each stage gradually decreases towards a last stage, each of plural digital image signal phase regulation circuits included in each stage except the last stage holds a plurality of input digital image signals at a predetermined phase, which is different from the phases of the other digital image signal phase regulation circuits induced in the same stage and supplies the digital image signals of the predetermined phase to a digital image signal phase regulation circuit included in a next stage, and the digital image signal phase regulation circuits included in the last stage holds the Nw digital image signals at an identical phase, which are supplied from a preceding stage.

13. An image processing apparatus in accordance with claim 1, further comprising:

an image memory that stores digital image signals; and a write controller that writes the digital image signals with respect to the Nw consecutive pixels into a consecutive storage area in the image memory.

14. An image processing apparatus in accordance with claim 13, wherein the write controller comprises:

multiple-stage digital image signal phase regulation circuits to output the Nw digital image signals, which are output in parallel from the series-to-parallel converter, at an identical phase, wherein the multiple-stage digital image signal phase regulation circuits have a hierarchical structure, where the number of circuits included in each stage gradually decreases towards a last stage, each of plural digital image signal phase regulation circuits included in each stage except the last stage holds a plurality of input digital image signals at a predetermined phase, which is different from the phases of the other digital image signal phase regulation circuits included in the same stage and supplies the digital image signals of the predetermined phase to a digital image signal phase regulation circuit included in a next stage, and the digital image signal phase regulation circuits included in the last stage holds the Nw digital image signals at an identical phase, which are supplied from a preceding stage.

15. An image processing apparatus in accordance with claim 13, further comprising:

Mr D-A converters, where Mr is an integer of not less than 2;

a second dot clock generation circuit that generates a second dot clock signal having a frequency suitable for sampling a second analog image signal-to-be-output;

a fifth sampling dock generation circuit that generates a fifth sampling clock signal, which has a frequency that is IINr the frequency of the second dot dock signal, where Nr is an integer of not less than 1 but not greater than Mr and represents a number of D-A converters that are actual used, the fifth sampling clock signal being synchronous with a second synchronizing signal of the second analog image signal;

a sixth sampling dock generation circuit that generates Nr sixth sampling clock signals based on the second dot clock signal, the sixth sampling dock signals having the frequency of the fifth sampling clock signal and different phases that are mutually shifted by one period of the second dot clock signal;

a read controller that reads digital image signals with respect to Nr consecutive pixels from the image memory in synchronism with the fifth sampling clock signal;

a D-A conversion selective control circuit that suspends operation of Mr-Nr) unused D-A converters according to the number Nr;

a read control signal regulator that determines the number Nr of the D-A converters used according to the frequency of the second dot clock signal to control the D-A conversion selective control circuit, regulates operation of the fifth sampling clock generation circuit and the sixth sampling clock generation circuit according to the number Nr, and causes the digital image signals with respect to the Nr consecutive pixels to be successively subjected to D-A conversion by the Nr D-A converters according to the Nr fifth sampling clock signals, so as to generate Nr partial analog image signals having different phases; and a video switch that sequentially switches the Nr partial analog image signals output from the Nr D-A converters synchronously with the second dot clock signal, so as to generate the second analog image signal.

16. An integrated circuit, comprising:

a first dot clock generation circuit that generates a first dot clock signal, which is synchronous with a first synchronizing signal of a first analog image signal and has a frequency suitable for sampling the first analog image signal;

an A-D converter that quantizes the first analog image signal to convert the first analog image signal into digital image signals, and sequentially outputs the digital image signals for respective pixels sampled in synchronism with the first dot clock signal;

a series-to-parallel converter having Mw signal hold circuits that sequentially hold the digital image signals with respect to Mw consecutive pixels, the series-to-parallel converter outputting in parallel the digital image signals with respect to Nw consecutive pixels, where Mw is an integer of not less than 2 and Nw is an integer of not less than 1 but not greater than Mw, Nw representing a number of signal hold circuits that are actually used;

a first sampling clock generation circuit that generates a first sampling clock signal, which is synchronous with the first synchronizing signal and has a frequency that is 1/Nw of the frequency of the first dot clock signal;

a second sampling clock generation circuit that generates Nw second sampling clock signals where Nw corresponds to the number of the signal hold circuits used, which is set based on the frequency of the first dot clock signal, wherein the Nw second sampling clock signals have the frequency of the first sampling clock signal and different phases that are mutually shifted by one period of the first dot clock signal, wherein the operation of the f sampling clock generation circuit and the second sampling clock generation circuit is regulated according to the number Nw of the signal hold circuits used, and the Nw second sampling clock signals are supplied to the Nw signal hold circuits, so that the digital image signals with respect to the Nw consecutive pixels are output from the series-to-parallel converter as one set of digital image signals.

17. An integrated circuit in accordance with claim 16, further comprising:

a selective control circuit that suspends operation of (Mw–Nw) signal hold circuits which are not used, wherein operation of the selective control circuit is controlled according to the number Nw of the signal hold circuits used.

18. An integrated circuit in accordance with claim 16, wherein the Nw second sampling clock signals having the mutually shifted phases are output together with the one set of digital image signals from the integrated circuit.

19. An integrated circuit in accordance with claim 16, wherein the second sampling clock generation circuit generates the Nw second sampling clock signals having the mutually shifted phases, in response to the first sampling clock signal and the first dot clock signal.

20. An integrated circuit in accordance with claim 16, wherein the second sampling dock generation circuit generates the Nw second sampling clock signals having the mutually shifted phases by successively delaying the first sampling clock signal.

21. An integrated circuit in accordance with 16, wherein the first sampling clock generation circuit further generates a 90-degree phase shit clock signal having a phase difference of 90 degrees from the first sampling clock signal and the second sampling clock generation circuit generates the Nw second sampling dock signals having the mutually shifted phases, in response to the first sampling clock signal and the 90 degree phase sift clock signal.

22. An integrated circuit in accordance with claim 16, wherein the second sampling clock generation circuit initializes the Nw second sampling clock signals having the mutually shifted phases, in response to the pulse of the first synchronizing signal, so that the first synchronizing signal and each of the Nw second sampling dock signals having the mutually shifted phases has a predetermined phase relation.

23. An integrated circuit in accordance with claim 16, further comprising:

a third sampling clock generation circuit that generates a third sampling clock signal having a phase suitable for sampling the one set of digital image signals, the third sampling clock signal being output from the image processing apparatus together with the one set of digital image signals.

24. An integrated circuit in accordance with claim 16, further comprising:

a fourth sampling clock generation circuit that generates a fourth sampling clock signal which is synchronous with the ft synchronizing signal and has a frequency that is Nx times the frequency of the first dot clock signal, where Nx is an integer of not less than 2, wherein the A-D converter comprises a ΔΣ modulation circuit and a digital filter, and quantizes the first analog image signal in response to the fourth sampling clock signal and sequentially outputs the digital image signals of the respective pixels sampled synchronously with the first dot clock signal.

* * * * *